(12) United States Patent
Kitamura et al.

(10) Patent No.: US 9,071,130 B2
(45) Date of Patent: Jun. 30, 2015

(54) SWITCHING POWER SUPPLY DEVICE, SWITCHING POWER SUPPLY CIRCUIT, AND ELECTRICAL EQUIPMENT

(75) Inventors: Noriyuki Kitamura, Kanagawa-ken (JP); Yuji Takahashi, Kanagawa-ken (JP); Koji Suzuki, Kanagawa-ken (JP); Koji Takahashi, Kanagawa-ken (JP); Toru Ishikita, Kanagawa-ken (JP)

(73) Assignee: Toshiba Lighting & Technology Corporation, Kanagawa-ken (JP)

( * ) Notice: Subject to any disclaimer, the term of this patent is extended or adjusted under 35 U.S.C. 154(b) by 898 days.

(21) Appl. No.: 13/169,441

(22) Filed: Jun. 27, 2011

(65) Prior Publication Data
US 2011/0316494 A1   Dec. 29, 2011

(30) Foreign Application Priority Data

Jun. 28, 2010 (JP) ................. 2010-146750
Jun. 30, 2010 (JP) ................. 2010-148525
May 31, 2011 (JP) ................. 2011-122867

(51) Int. Cl.
*G05F 1/00* (2006.01)
*H02M 1/088* (2006.01)
(Continued)

(52) U.S. Cl.
CPC ............ *H02M 1/088* (2013.01); *H02M 3/1563* (2013.01); *H05B 33/0815* (2013.01); *H02M 1/4225* (2013.01); *H01L 23/552* (2013.01); *H01L 2224/16225* (2013.01); *H01L 2224/32225* (2013.01); *H01L 2224/73204* (2013.01); *H01L 2924/14* (2013.01); *H01L 2924/19106* (2013.01); *Y02B 70/126* (2013.01); *H01L 2924/13062* (2013.01)

(58) Field of Classification Search
CPC .... H02M 3/158; H02M 3/1586; H02M 1/088
USPC ........... 323/282–288, 268, 271; 315/291, 294
See application file for complete search history.

(56) References Cited

U.S. PATENT DOCUMENTS

2003/0025120 A1* 2/2003 Chang ............................ 257/92
2005/0184317 A1* 8/2005 Hatakeyama et al. ........ 257/262
(Continued)

FOREIGN PATENT DOCUMENTS

JP    63-174569    7/1988
JP    06-325949    11/1994
(Continued)

OTHER PUBLICATIONS

First Office Action Notification for Chinese Patent Application No. 201110174822.8 Dated Aug. 9, 2013, 10 pgs.
(Continued)

*Primary Examiner* — Jue Zhang
(74) *Attorney, Agent, or Firm* — Amin, Turocy & Watson, LLP

(57) ABSTRACT

According to an embodiment of the invention, there is provided a switching power supply device including an integrated body and a plurality of external terminals. In the integrated body, a first switching element, a constant current element, and a diode are connected in series. The plurality of external terminals include a first external terminal connected to a main terminal of an element disposed on one end side of the integrated body and a second external terminal connected to a main terminal of an element disposed on another end side of the integrated body.

10 Claims, 14 Drawing Sheets

(51) Int. Cl.
*H02M 3/156* (2006.01)
*H05B 33/08* (2006.01)
*H02M 1/42* (2007.01)
*H01L 23/552* (2006.01)

(56) References Cited

U.S. PATENT DOCUMENTS

2006/0001381 A1* 1/2006 Robinson et al. .......... 315/185 R
2009/0066264 A1* 3/2009 Huang et al. ................... 315/294
2010/0164404 A1* 7/2010 Shao et al. ..................... 315/297

FOREIGN PATENT DOCUMENTS

| JP | 2002-064971 | 2/2002 |
|----|-------------|--------|
| JP | 2004-119078 | 4/2004 |
| JP | 2005-117860 | 4/2005 |
| JP | 2006-223016 | 8/2006 |
| JP | 2007-006658 | 1/2007 |
| JP | 2007-115594 | 5/2007 |
| JP | 4123886 | 5/2008 |
| JP | 2009-027025 | 2/2009 |
| JP | 2009-283840 | 12/2009 |

OTHER PUBLICATIONS

Japanese Office Action for Japanese Patent Application No. 2010-148525 mailed on Apr. 9, 2014.

Office Action of Notification of Reason(s) for Refusal for Japanese Patent Application No. 2011-122867 Dated Feb. 19, 2015, 4 pages.

* cited by examiner

SWITCHING POWER SUPPLY DEVICE, SWITCHING POWER SUPPLY CIRCUIT, AND ELECTRICAL EQUIPMENT

CROSS-REFERENCE TO RELATED APPLICATIONS

This application is based upon and claims the benefit of priority from the prior Japanese Patent Application No. 2010-146750, filed on Jun. 28, 2010, Japanese Patent Application No. 2010-148525, filed on Jun. 30, 2010, and Japanese Patent Application No. 2011-122867, filed on May 31, 2011; the entire contents of which are incorporated herein by reference.

FIELD

Embodiments described herein relate generally to a switching power supply device, a switching power supply circuit, and an electrical equipment.

BACKGROUND

A switching power supply is a power supply device using a switching element to convert and regulate electrical power in a power conversion device for obtaining a desired output power from an input power. Examples of the switching power supply include a DC-DC converter for converting a DC power to another DC power.

In contrast to the series regulator which dissipates Joule heat resulting from its voltage drop, the switching power supply can reduce power loss. Hence, the switching power supply can achieve high accuracy and high efficiency. With regard to the relationship between the input voltage and the output voltage, the switching power supply has circuit configurations such as step-down type, step-up type, and step-up/down type.

Now, there is a semiconductor element formed on a semiconductor substrate made of a semiconductor having a wide bandgap such as silicon carbide (SIC), gallium nitride (GaN), and diamond. Such a semiconductor element is drawing attention as having the potential to significantly break through the performance limit of Si power devices. Hence, wide bandgap semiconductor devices are highly promising also in the field of power devices. Here, the wide bandgap semiconductor refers to a semiconductor having a wider bandgap than gallium arsenide (GaAs), which has a bandgap of approximately 1.4 eV. For instance, wide bandgap semiconductors include semiconductors having a bandgap of 1.5 eV or more, such as gallium phosphide (GaP, bandgap of approximately 2.3 eV), gallium nitride (GaN, bandgap of approximately 3.4 eV), diamond (C, bandgap of approximately 5.27 eV), aluminum nitride (AlN, bandgap of approximately 5.9 eV), and silicon carbide (SiC).

Typical semiconductor elements based on wide bandgap semiconductor include a junction FET (JFET), static induction transistor (SIT), metal-semiconductor FET (metal-semiconductor field-effect transistor, MESFET), heterojunction field-effect transistor (HFET), high-electron-mobility transistor (HEMT), and accumulation FET. Currently, wide bandgap semiconductor elements in practical use typically have normally-on characteristics. However, wide bandgap semiconductor elements having normally-off characteristics can also be obtained.

Wide bandgap semiconductor elements have good features as described above. The wide bandgap semiconductor element can be used as a switching element of the switching power supply for high frequency operation above megahertz (MHz). Thus, significant downsizing of the switching power supply can be expected.

CITATION LIST

Patent Literature

Patent Citation 1 Japanese Patent No. 4123886
Patent Citation 2 JP-A 2007-006658 (Kokai)

SUMMARY OF THE INVENTION

However, when the switching power supply is operated at high frequency of MHz or more, for example, 10 MHz or more using wide bandgap semiconductor, difficulty is involved on following points.
(1) because of difficulty in achieving an oscillator responsive to high frequency, not adequate to control by separate excitation control.
(2) difficult in control at high frequency.
(3) influence of interconnect and structural impedance involved in high frequency operation is increased and operation is influenced.

Then, in control by self-excitation, conventionally a resistance element and a feedback circuit of a current feedback type have been needed. The resistance element is inserted in series with the switching element and detects increasing current flowing in an inductor. The feedback circuit includes a control circuit which turns off the switching element when the voltage drop of the resistance element reaches a preset threshold. Therefore, circuit configuration is complicated and furthermore downsizing becomes difficult.

Here, by high frequency operation, the noise component emitted from the mounted device increases to cause electromagnetic interference between circuit elements. Thus, a problem is to reduce this electromagnetic interference while maintaining downsizing.

Furthermore, in addition to the above problem, the downsizing involves significant temperature increase of circuit parts such as the switching element due to the heat generated from the circuit parts. Hence, it is also important to decrease the temperature of circuit parts.

The object of an embodiment of the invention is to provide a switching power supply device and a switching power supply circuit which are able to perform turn-off control of the switching element without using the resistance element for current detection, can be adapted to a switching power supply of diverse circuit configurations, and furthermore achieve significant downsizing of the switching power supply.

The object of the embodiment of the invention is to provide an electrical equipment including the switching power supply device or the switching power supply circuit. The switching power supply device facilitates downsizing by increasing packaging density and reduces electromagnetic interference between mounted circuit components.

Solution to Problem

According to an embodiment of the invention, there is provided a switching power supply device including an integrated body and a plurality of external terminals. In the integrated body, a first switching element, a constant current element, and a diode are connected in series. The plurality of external terminals include a first external terminal connected to a main terminal of an element disposed on one end side of the integrated body and a second external terminal connected to a main terminal of an element disposed on another end side of the integrated body.

According to one other embodiment of the invention, there is provided a switching power supply circuit including a first switching element, a constant current element and a diode. The constant current element is connected in series to the first switching element and is configured to turn off the first switching element when current of the first switching element exceeds a predetermined current value. The diode is connected in series to either of the first switching element and the constant current element, and allows current when the first switching element is off.

According to one other embodiment of the invention, there is provided an electrical equipment including a main body and a power supply. The power supply includes a switching power supply circuit and is configured to supply power supply voltage to the main body. The switching power supply circuit includes a first switching element, a constant current element and a diode. The constant current element is connected in series to the first switching element and is configured to turn off the first switching element when current of the first switching element exceeds a predetermined current value. The diode is connected in series to either of the first switching element and the constant current element, and passes current when the first switching element is off.

BRIEF DESCRIPTION OF THE DRAWINGS

FIG. 2A is a schematic top view, and FIG. 2B is a sectional view taken along line A-A' of FIG. 2A;

FIG. 15A is a schematic partial sectional perspective view, and FIG. 15B is a partial enlarged view;

DETAILED DESCRIPTION

Figure 1:
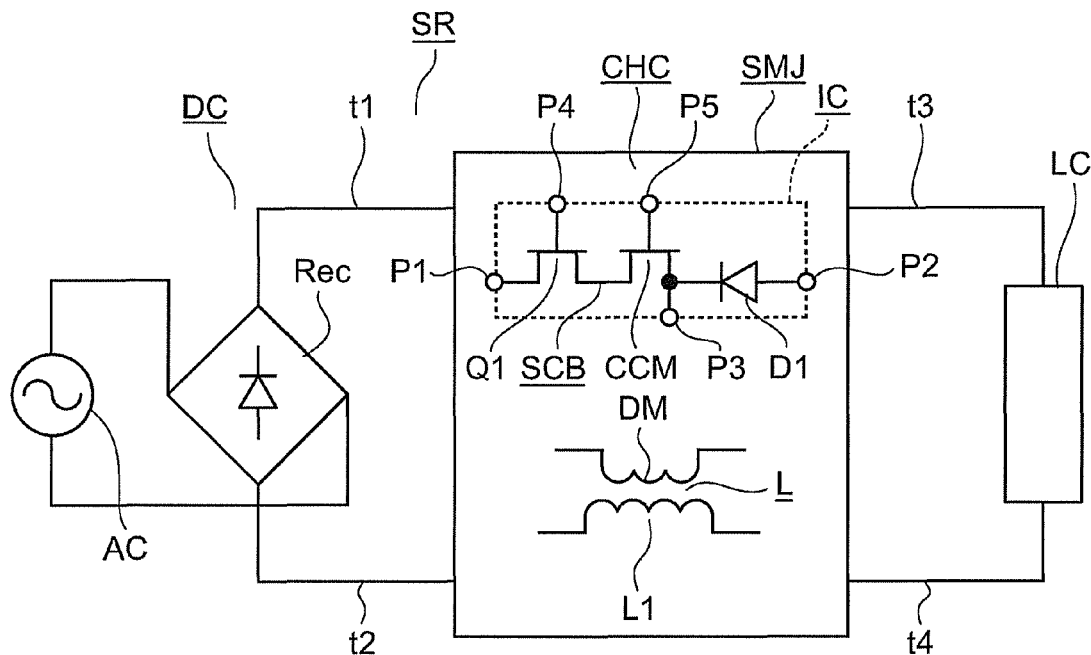
FIG. 1 is a circuit diagram illustrating a switching power supply device according to a first embodiment.

Embodiments will now be described in detail with reference to the drawings.

The drawings are schematic or conceptual. The relationship between the shape and the width of each portion, and the size ratio between the portions, for instance, are not necessarily identical to those in reality. Furthermore, the same portion may be shown with different dimensions or ratios depending on the figures.

In the specification and the drawings, components similar to those described previously with reference to earlier figures are labeled with like reference numerals, and the detailed description thereof is omitted as appropriate.

First, a first embodiment is described.

FIG. 1 is a circuit diagram illustrating a switching power supply device according to the first embodiment.

Figure 2A:
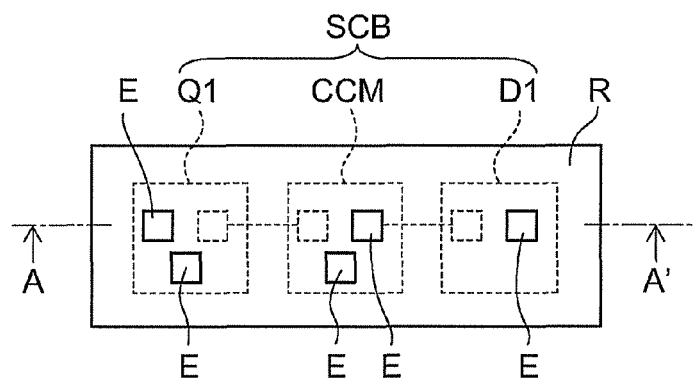
FIGS. 2A and 2B illustrate the configuration of the switching power supply device.
Figure 2B:
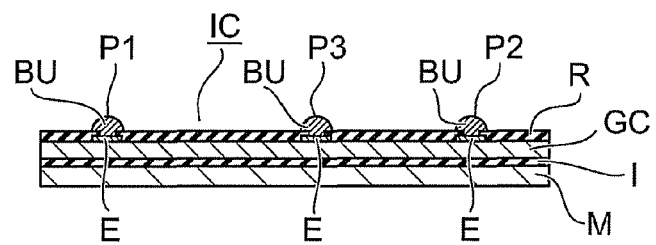

FIGS. 2A and 2B illustrate the configuration of the switching power supply device. More specifically, FIG. 2A is a schematic top view, and FIG. 2B is a sectional view taken along line A-A' of FIG. 2A.

As shown in FIGS. 1 to 2B, the switching power supply device IC according to the first embodiment includes an integrated body SCB in which a first switching element Q1, a constant current element CCM, and a diode D1 are connected in series and integrated. Furthermore, the switching power supply device IC includes first to fifth external terminals P1-P5 as a plurality of external terminals. The first external terminal P1 is connected to the main terminal of the element disposed on one end side of the integrated body SCB. The second external terminal P2 is connected to the main terminal of the element disposed on the other end side of the integrated body SCB. This switching power supply device IC can constitute a switching power supply SR in combination with external circuit parts, including a first inductor L1 as a main circuit part. The switching power supply device IC is operated in response to input of direct current power from a direct current power supply DC. The switching power supply device IC energizes a load circuit LC with its output direct current power.

In the embodiment, the switching element Q1 is a element responsible for switching the switching power supply SR. The switching element Q1 may be either a switching element having normally-on characteristics, i.e., a normally-on type switch, or a switching element having normally-off characteristics, i.e., a normally-off type switch.

With regard to switching elements based on wide bandgap semiconductor, switching elements having normally-on characteristics are more available and faster in switching, and have lower on-resistance. The normally-off type switch is more manageable because it is off when powered on. However, for operation in self-excited oscillation, the normally-off type switch needs a start-up circuit for starting oscillation. The turn-off operation of the normally-on type switch is preferably performed by the constant current element CCM. Because the normally-on type switch does not need the addition of a start-up circuit for power-on time, the normally-on type switch can simplify the circuit. This contributes to downsizing of the switching power supply device IC and the switching power supply SR based thereon. Furthermore, the switching threshold voltage of the normally-on type switch is preferably negative, because this facilitates turn-off control using a second inductor DW magnetically coupled to the first inductor L1. However, even the normally-off type switch has basically no problem, because it only needs the addition of a simple start-up circuit.

The first switching element Q1 can be a switching element based on wide bandgap semiconductor, such as GaN-HEMT. Then, the switching characteristics at high frequencies are significantly improved. Hence, such a switching element is preferable as the first switching element Q1 of the embodiment, which is operated above MHz, and preferably above 10 MHz. If the operating frequency of the switching power supply SR is high as described above, the switching loss decreases. Furthermore, the first and second inductors L1, DW are downsized. Hence, the switching power supply SR can be significantly downsized. Here, the wide bandgap semiconductor can be any semiconductor having a wide bandgap such as silicon carbide (SiC), gallium nitride (GaN), and diamond in the semiconductor substrate.

In the embodiment, the constant current element CCM is an element having constant current characteristics. When a predetermined constant current value is exceeded, the constant current element CCM turns off the first switching element Q1. The constant current element CCM is an element operable under the frequency in the region or over MHz, and preferably in the frequency region above 10 MHz. For instance, the constant current element CCM can be a junction FET. Preferably, a GaN-HEMT, which is a kind of junction FET, is used as the constant current element CCM. In this case, the constant current value can be changed by changing the gate voltage. Due to its high speed, after reaching the constant current value, the voltage of the constant current element CCM rapidly increases and turns off the first switching element Q1. In the case where the constant current value is fixed, a constant current diode can also be used as the constant current element CCM.

To turn off the first switching element Q1, the circuit is configured so that the constant current element CCM is inserted in series with the first switching element Q1 in the circuit in which a current flows in the first inductor L1 during the on-time of the first switching element Q1. Furthermore, the circuit is configured so that the constant current element CCM is inserted also in the driver circuit of the first switching element Q1 including the second inductor DW for driving the first switching element Q1.

In the embodiment, the diode D1 is operable in the frequency region above MHz. The diode D1 provides a circuit for the flowing out of decreasing current (regenerative current) from the first inductor L1 of the switching power supply SR described later. The above frequency condition can be easily satisfied by using a diode of wide bandgap semiconductor such as GaN. The above diode D1 is favorably operated even in the frequency region above 10 MHz. This enables switching at even higher speed.

Thus, the integrated body SCB is operable in the frequency region above MHz, and preferably operable even in the frequency region above 10 MHz. Each element in the integrated body SCB is made of wide bandgap semiconductor having a wider bandgap than gallium arsenide (GaAs).

In the integrated body SCB of the switching power supply device IC according to the embodiment, as shown in FIG. 1, the first switching element Q1, the constant current element CCM, and the diode D1 are connected in series in this order with the polarity as shown. The first external terminal P1 is connected to one main terminal (drain) of the first switching element Q1. The second external terminal P2 is connected to the other main terminal (anode) of the diode D1. The third external terminal P3 is connected to the other main terminal (source) of the constant current element CCM and one main terminal (cathode) of the diode D1. The fourth external terminal P4 is connected to the control terminal (gate) of the first switching element Q1. The fifth external terminal P5 is connected to the control terminal (gate) of the constant current element CCM. Thus, the switching power supply device IC according to the embodiment includes five external terminals.

As shown in FIGS. 2A and 2B, the switching power supply device IC is configured in e.g. a GaN-based multi-chip structure and flip chip mounted. As an alternative configuration, if desired, the first switching element Q1, the constant current element CCM, and the diode D1 can be connected in series and formed into a GaN-based single chip.

As shown in FIG. 2B, the GaN-based multi-chip structure is configured as a stacked body including e.g. a metal substrate M, an insulating layer I, a GaN chip GC, a resist layer R, and a solder bump BU. With regard to the GaN chip GC, the relatively large rectangular portion indicated by the dotted line in FIG. 2A corresponds to each chip of the first switching element Q1, the constant current element CCM, and the diode D1, which are integrated and connected in series. The relatively small rectangular portion indicated by the solid line in the figure is a bump opening formed in the resist layer R. The bump opening exposes the electrode E constituting the terminal portion of the first switching element Q1, the constant current element CCM, and the diode D1 to which the plurality of external terminals P1-P5 are connected. Furthermore, the relatively small rectangular portion indicated by the dotted line is a terminal portion like the foregoing, but to which the external terminal is not connected. The three solder bumps BU shown in FIG. 2B respectively form the first external terminal P1, the second external terminal P2, and the third external terminal P3. Except the solder bumps BU, the outer periphery of the switching power supply device IC can be surrounded with a known package (not shown).

According to the embodiment, the switching power supply device IC is configured as described above. Thus, when an increasing current flowing in the constant current element CCM reaches the constant current value and is about to further increase, the voltage across the constant current element CCM rapidly increases. Then, by the increase of the voltage across the constant current element CCM, the potential of the other main terminal (source) incorporated in the driver circuit of the first switching element Q1 can be made relatively higher than the potential of the control terminal (gate). This makes the potential of the control terminal lower than the threshold voltage of the first switching element Q1. Hence, the first switching element Q1 can be turned off. This circuit operation is made easier and more reliable if the first switching element Q1 is a normally-on type switch and has a negative threshold voltage. However, this circuit operation is effective also for a normally-off type switch.

As shown in FIG. 1, the switching power supply SR configured by using the switching power supply device IC of the embodiment includes a direct current power supply DC and a chopper circuit CHC. The input end is connected to an alternating current power supply AC. The output end is connected with a load circuit LC.

In the embodiment, the concept of the chopper circuit CHC includes various choppers such as step-down chopper, step-up chopper, and step-up/down chopper. Furthermore, the chopper circuit CHC also includes those of the synchronous rectification type. Each of the above choppers is primarily composed of the switching power supply device IC and the first inductor L1. By turning on the first switching element Q1, an increasing current flows from the direct current power supply DC to the first inductor L1. By turning off the first switching element Q1, the electromagnetic energy accumulated in the first inductor L1 is released, and a decreasing current flows through the diode D1. The foregoing operation is repeated. The voltage of the direct current power supply DC is DC-DC converted and outputted as a direct current voltage to the output end. This point is common to the above choppers. In the case of the synchronous rectification type, in addition to the foregoing, when the first switching element Q1 is off, the second switching element Q2 is turned on. When the first switching element Q1 is turned on, the second switching element Q2 is turned off.

In the embodiment, the chopper circuit CHC includes a second inductor DW magnetically coupled to the first inductor L1. This second inductor DW detects the increasing current flowing in the first inductor L1 in response to turn-on of the first switching element Q1. By its output voltage, the second inductor DW maintains the first switching element Q1 in the on-state. That is, the second inductor DW maintains the first switching element Q1 in the on-state by supplying the control terminal (gate) of the first switching element Q1 with the potential induced by the increasing current flowing in the first inductor L1.

Furthermore, the chopper circuit CHC includes direct current input ends t1, t2 and direct current output ends t3, t4. The inside of the chopper circuit CHC is configured from one of various known choppers such as step-down chopper, step-up chopper, and step-up/down chopper.

The direct current power supply DC inputs a direct current voltage before conversion to the above chopper circuit CHC. The direct current power supply DC may be of any configuration as long as it can output a direct current voltage. For instance, the direct current power supply DC can be configured primarily from a rectifier circuit Rec, and can include a smoothing circuit composed of a smoothing capacitor if desired. Alternatively, the direct current power supply DC can be based on a rechargeable cell such as a battery. In FIG. 1, the rectifier circuit Rec is preferably made of a bridge rectifier circuit. In the configuration illustrated in FIG. 1, the alternating current voltage of the alternating current power supply AC such as commercial alternating current power supply is full-wave rectified and outputted as a direct current voltage.

In the first embodiment, if desired, the switching power supply SR can be modularized to configure a switching power supply module. This module is preferable for a switching power supply SR operating in the frequency region above MHz, and preferably in the frequency region above 10 MHz. Each output terminal provided in the switching power supply module is intended for direct current, and used only for direct current input/output. Hence, the operation is stable, and the switching power supply SR can be significantly downsized. Furthermore, the switching power supply SR can be provided adjacent to a load circuit LC, such as the light emitting diode of an illumination device. This contributes to overall significant downsizing of e.g. illumination devices.

In the following, with reference to FIGS. 3 to 13, switching power supply circuits SR based on the switching power supply device IC according to the first embodiment are described. In the figures, the same components as those in FIG. 1 are labeled with like reference numerals, and the description thereof is omitted.

A second embodiment is described.

Figure 3:
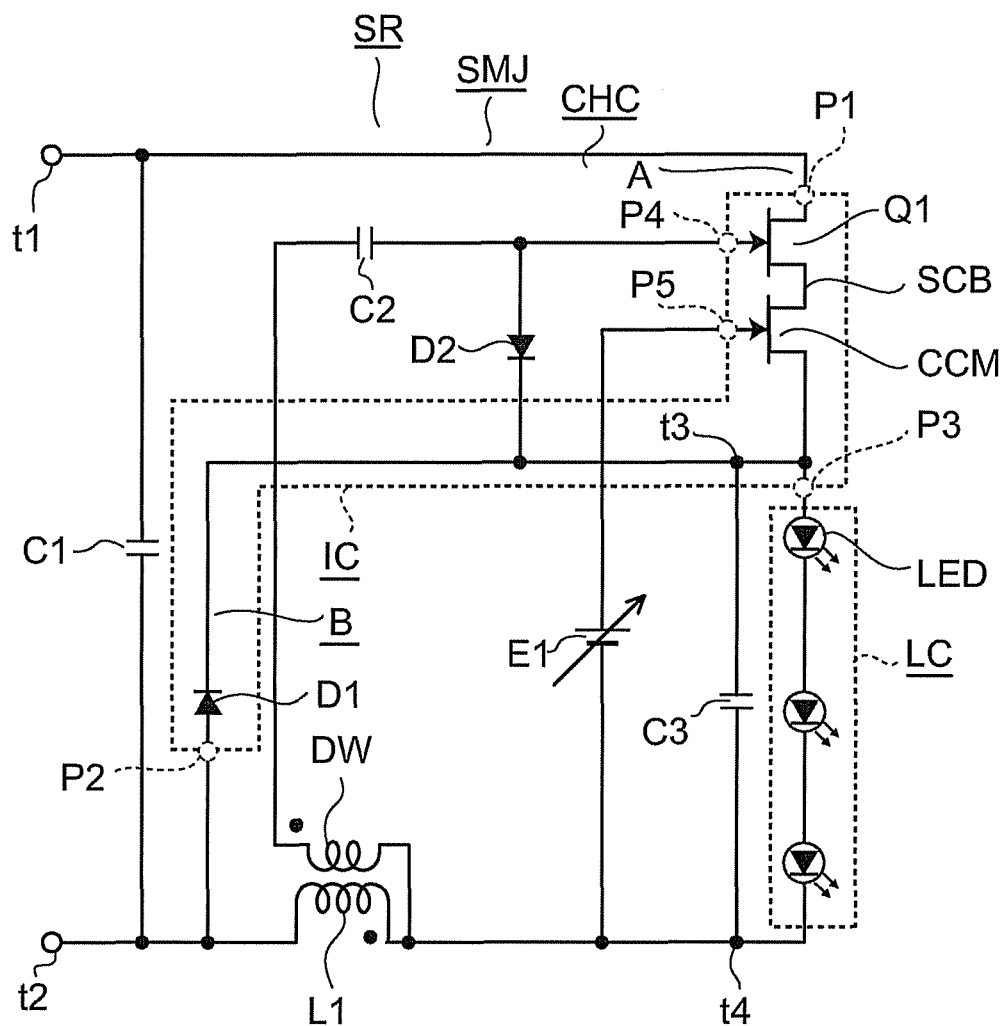
FIG. 3 is a circuit diagram illustrating a switching power supply circuit according to a second embodiment.

FIG. 3 is a circuit diagram illustrating a switching power supply circuit according to the second embodiment.

As shown in FIG. 3, the chopper circuit CHC is of the step-down type. For each of the first switching element Q1 and the constant current element CCM of its switching power supply device IC, for instance, a GaN-HEMT is used. The first inductor L1 is connected between the load circuit LC and the input end t2. The second inductor DW is connected between the fourth external terminal P4 and the third external terminal P3 of the switching power supply device IC through the load circuit LC and the coupling capacitor C2. That is, the second inductor DW is connected between the control terminal (gate) of the first switching element Q1 and the other main terminal (source) of the constant current element CCM.

In the switching power supply device IC, the first external terminal P1 is connected to the input end t1. The second external terminal P2 is connected to the input end t2. The third external terminal P3 is connected to one end of the load circuit LC.

The high frequency bypass capacitor C1 is connected between the input ends t1, t2 of the chopper circuit CHC. As a load circuit LC, a light emitting diode LED is connected. Although FIG. 3 illustrates a configuration including three light emitting diodes LED, an arbitrary number of light emitting diodes may be connected. An output capacitor C3 is connected across the load circuit LC.

The first circuit A is configured as a series circuit of the input end t1, the first switching element Q1, the constant current element CCM, the parallel circuit of the output capacitor C3 and the load circuit LC, the first inductor L1, and the input end t2. The second circuit B is configured as a closed circuit of the first inductor L1, the diode D1, and the parallel circuit of the output capacitor C3 and the load circuit LC.

In the constant current element CCM, the gate potential is made variable using a potential source E1 having adjustable potential difference. Thus, the constant current element CCM is configured so that its constant current value is adjustable. The potential source E1 having adjustable potential difference is connected between the control terminal (gate) and the other main terminal (source) of the constant current element CCM through the fifth external terminal P5 of the switching power supply device IC and the load circuit LC. In the case where the constant current element CCM is an element having normally-on characteristics, if desired, the potential source E1 can also be configured so that negative (−) potential can be outputted as well. Then, by turning off the constant current element CCM, the first switching element Q1 can be turned off. This extends the range of control. Furthermore, a clamp diode D2 clamps the voltage VGS between the control terminal (gate) and the main terminal (source) of the first switching element Q1 to e.g. 0.6 V or less. The gate-source voltage VGS of the first switching element Q1 is level shifted to the negative (−) potential side. Thus, the first switching element Q1 can be reliably turned on and off.

Next, the circuit operation of the switching power supply circuit shown in FIG. 3 is described.

When the direct current power supply DC is powered on, the first switching element Q1 of the chopper circuit CHC is turned on. A current starts to flow in the first circuit A from the direct current power supply DC through the first switching element Q1 and the constant current element CCM. The current linearly increases. Thus, electromagnetic energy is accumulated in the first inductor L1. Here, during the on-time of the first switching element Q1, the gate-source voltage VGS of the first switching element Q1 is zero. Until the increasing current reaches the constant current value of the constant current element CCM, the voltage across the constant current element CCM is limited to below a nearly constant value. Here, while the increasing current flows in the first inductor L1, the terminal voltage of the first inductor L1 has positive polarity.

When the increasing current reaches the constant current value of the constant current element CCM, the current flowing in the first inductor L1 is about to further increase. Hence, the voltage VCCM across the constant current element CCM increases like a pulse. Accordingly, the main terminal (source) potential of the first switching element Q1 is made higher than the potential of the control terminal (gate). As a result, the control terminal is definitely placed at a relatively negative potential, and the first switching element Q1 is turned off. Thus, the increasing current flowing into the first inductor L1 is blocked by the turn-off of the first switching element Q1.

At the same time as the first switching element Q1 is turned off, the electromagnetic energy accumulated in the first inductor L1 starts to be released. Thus, a decreasing current (regenerative current) starts to flow in the second circuit B. Here, while the decreasing current flows, the voltage polarity of the first inductor L1 is inverted to negative. This induces a potential in the second inductor DW such that the control terminal of the first switching element Q1 is placed at a negative potential. The induced negative potential is applied between the control terminal (gate) and the other main terminal (source) of the first switching element Q1 through the constant current element CCM. The first switching element Q1 is maintained in the off-state.

When the decreasing current flowing in the second circuit B becomes zero, the induction of the negative potential applied to the control terminal (gate) of the first switching element Q1 is stopped. Simultaneously, back electromotive force induces a potential in the second inductor DW so that the above control terminal becomes positive. Hence, the first switching element Q1 is again turned on. Subsequently, the circuit operation like the foregoing is repeated.

In the above operation, the on-duty of the first switching element Q1 (the ratio Ton/T of the on-time Ton of the first switching element Q1 to one cycle T) is denoted by α, the input voltage is denoted by Vin, and the output voltage is denoted by Vout. Then, in the step-down chopper circuit, the relation Vout=Vin·α/1 holds. Thus, an output voltage lower than the input voltage is obtained.

As is clear from the above circuit operation, the chopper circuit CHC performs step-down chopper operation. In the load circuit LC connected between the output ends t3, t4, an output current of alternate flow of the increasing current and the decreasing current is formed. By the direct current component thereof, the light emitting diode LED illuminates. The output capacitor C3 bypasses high frequency components.

Furthermore, the constant current value of the constant current element CCM is configured to be variable using a potential source E1 having adjustable potential difference. This facilitates defining a desired load current. Furthermore, by feedback control of the potential difference of the potential source E1 with respect to the variation of the power supply voltage, the variation of optical output of the light emitting diode with respect to the variation of the power supply voltage can also be suppressed. Furthermore, the voltage drop of the constant current element CCM and the load circuit LC is added to the negative potential of the second inductor DW applied to the control terminal of the first switching element Q1. Hence, even if the absolute value of the negative potential of the second inductor DW is relatively small, the first switching element Q1 can be maintained in the off-state.

Next, a third embodiment is described.

Figure 4:
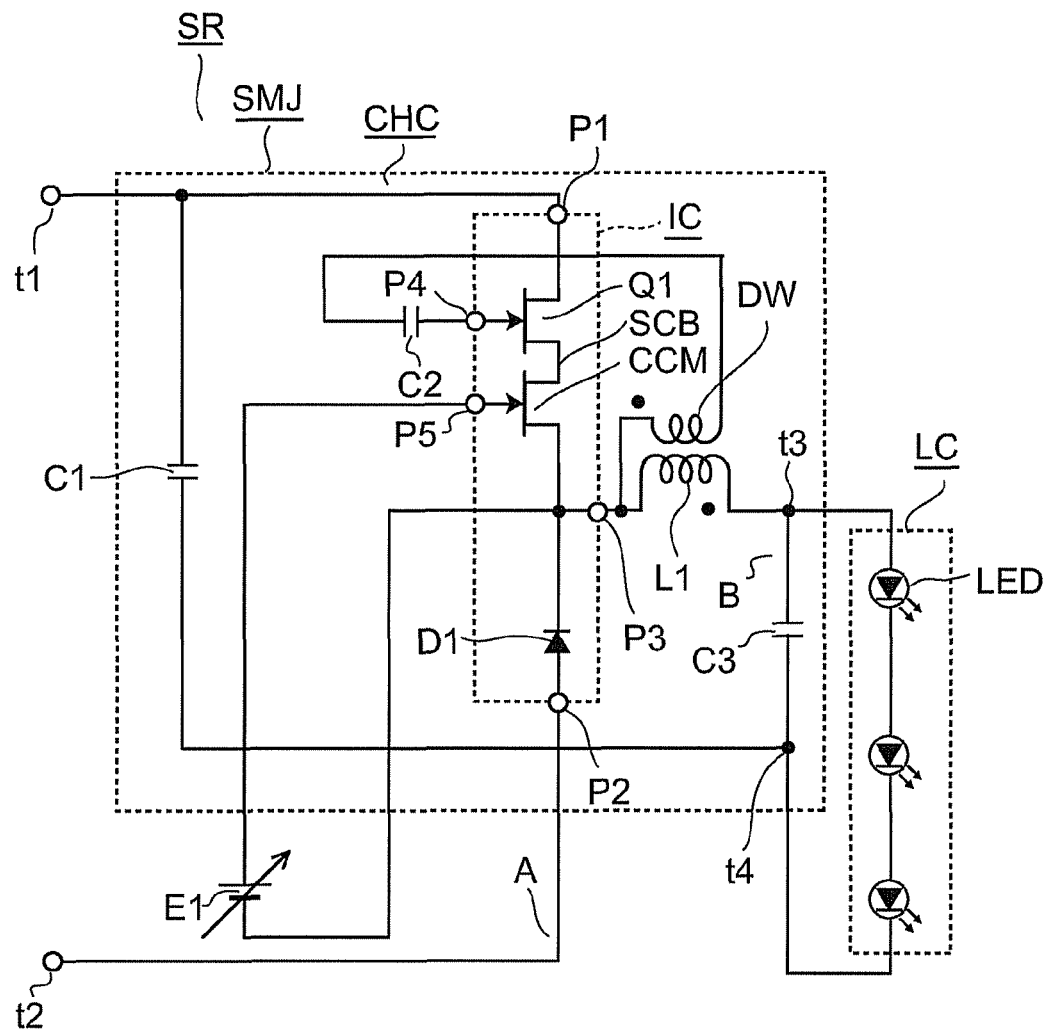
FIG. 4 is a circuit diagram illustrating a switching power supply circuit according to a third embodiment.

FIG. 4 is a circuit diagram illustrating a switching power supply circuit according to the third embodiment.

The switching power supply circuit SR shown in FIG. 4 is of the step-down type as in the second embodiment. However, the first inductor L1 is connected to a position between the constant current element CCM and the parallel circuit of the output capacitor C3 and the load circuit LC. The potential source E1 having adjustable potential difference is directly connected between the control terminal (gate) and the other main terminal (source) of the constant current element CCM. Furthermore, the second inductor DW is connected at its both ends between the fourth external terminal P4 and the third external terminal P3 of the switching power supply device IC through the coupling capacitor C2. In FIGS. 4 to 13 showing the fourth and subsequent embodiments, the same components as those in FIG. 3 are labeled with like reference numerals, and the description thereof is omitted.

The circuit operation is similar to that of FIG. 3.

Next, a fourth embodiment is described.

Figure 5:
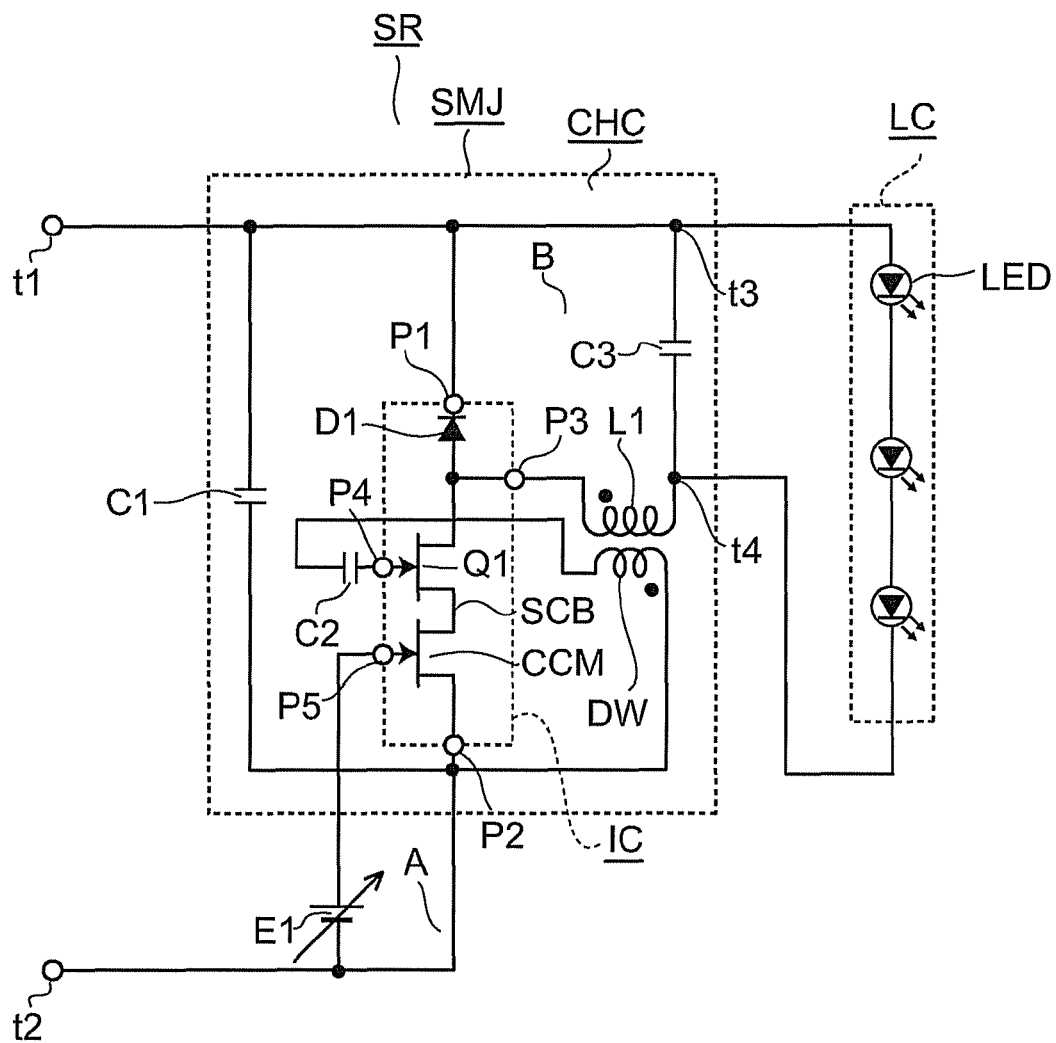
FIG. 5 is a circuit diagram illustrating a switching power supply circuit according to a fourth embodiment.

FIG. 5 is a circuit diagram illustrating a switching power supply circuit according to the fourth embodiment.

The switching power supply circuit SR shown in FIG. 5 is of the step-down type. However, the configuration of the integrated body SCB in the switching power supply device IC is different from that in the switching power supply device shown in FIGS. 3 and 4. Specifically, the manner of series connection of the first switching element Q1, the constant current element CCM, and the diode D1 is different. More specifically, from top to bottom of the figure, they are connected in series in the order of the diode D1, the first switching element Q1, and the constant current element CCM. Furthermore, the first external terminal P1 is connected to one main terminal of (cathode) of the diode D1. The second external terminal P2 is connected to the other main terminal (source) of the constant current element CCM. The third external terminal P3 is connected to the other main terminal (anode) of the diode D1 and one main terminal (drain) of the first switching element Q1.

The first inductor L1 is connected as in the switching power supply circuit SR shown in FIG. 4. However, the load circuit LC is connected between the input end t1 and the inductor L1. The second inductor DW is connected as in the switching power supply circuit SR shown in FIG. 4. The potential source E1 having adjustable potential difference is directly connected between the control terminal (gate) and the main terminal (source) of the constant current element CCM as in the switching power supply circuit SR shown in FIG. 4.

Next, a fifth embodiment is described.

Figure 6:
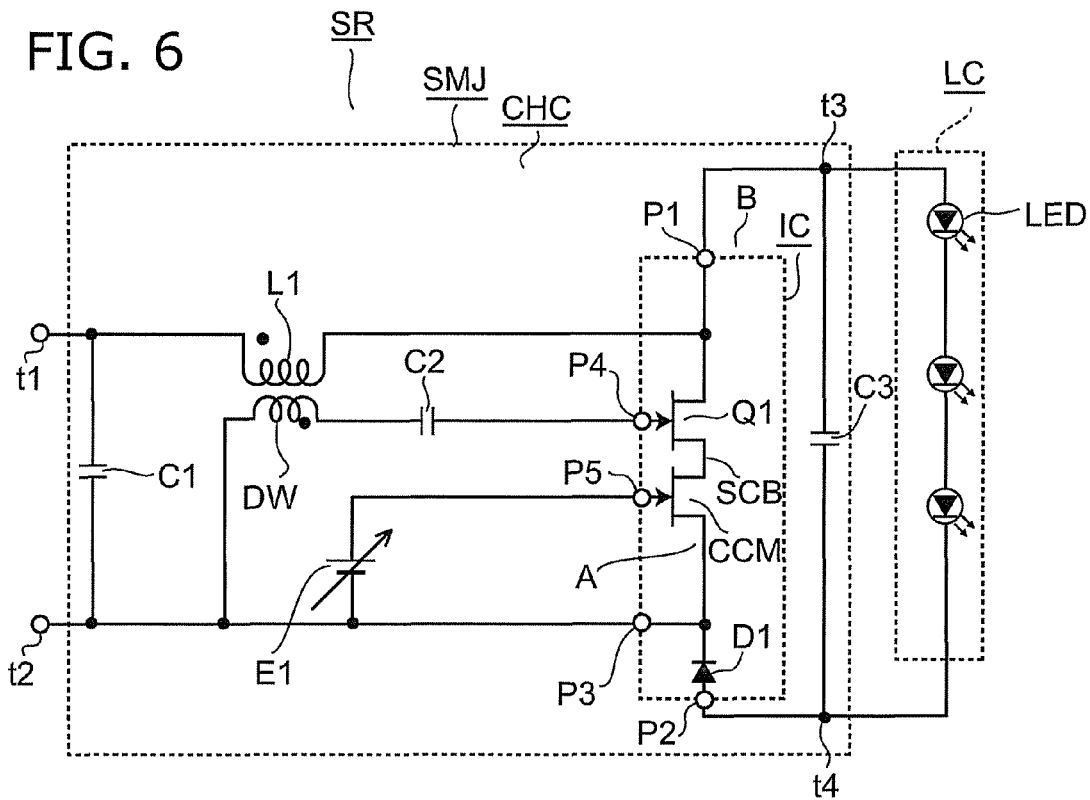
FIG. 6 is a circuit diagram illustrating a switching power supply circuit according to a fifth embodiment.

FIG. 6 is a circuit diagram illustrating a switching power supply circuit according to the fifth embodiment.

The switching power supply circuit SR shown in FIG. 6 is of the step-up type. The series circuit of the input end t1, the first inductor L1, the first switching element Q1, the constant current element CCM, and the input end t2 constitutes a first circuit A. The series circuit of the input end t1, the first inductor L1, the parallel circuit of the output capacitor C3 and the load circuit LC, the diode D1, and the input end t2 constitutes a second circuit B.

The switching power supply device IC includes an integrated body SCB in which a first switching element Q1, a constant current element CCM, and a diode D1 are connected in series and integrated. Furthermore, the switching power supply device IC includes first to fifth external terminals P1-P5. The configuration of this switching power supply device IC is similar to that in the switching power supply circuit SR shown in FIGS. 3 and 4.

The second inductor DW is connected between the control terminal (gate) and the other main terminal (source) of the first switching element Q1 through the constant current element CCM and the coupling capacitor C2. The potential source E1 having adjustable potential difference is directly connected between the control terminal (gate) and the other main terminal (source) of the constant current element CCM.

Next, the circuit operation of the switching power supply circuit SR shown in FIG. 6 is briefly described. When the direct current power supply DC is powered on between the input ends t1, t2, the first switching element Q1 is turned on. Then, an increasing current flows in the first circuit A. The on-state of the first switching element Q1 is maintained because the induction voltage of the second inductor DW applies forward bias to the control terminal (gate) of the first switching element Q1. When the increasing current reaches the constant current value of the constant current element CCM, the voltage drop of the constant current element CCM rapidly increases. Hence, the potential of the control terminal (gate) of the first switching element Q1 becomes negative relative to the potential of the other main terminal (source). Thus, the first switching element Q1 is turned off.

When the first switching element Q1 is turned off, the electromagnetic energy accumulated in the first inductor L1 is released, and a decreasing current flows in the second circuit B. The flow of the decreasing current energizes the load circuit LC and activates the load LED. While the decreasing current flows, the second inductor DW applies reverse bias to the first switching element Q1. Hence, the first switching element Q1 is maintained in the off-state. When the decreasing current becomes zero, the reverse bias to the control terminal (gate) of the first switching element Q1 is lost. Hence, the first switching element Q1 is again turned on. The foregoing operation is repeated.

In the above operation, the on-duty of the first switching element Q1 is denoted by α, the input voltage is denoted by Vin, and the output voltage is denoted by Vout. Then, in the step-up type, the relation Vout=Vin·1/α holds. Thus, an output voltage higher than the input voltage is obtained.

Next, a sixth embodiment is described.

Figure 7:
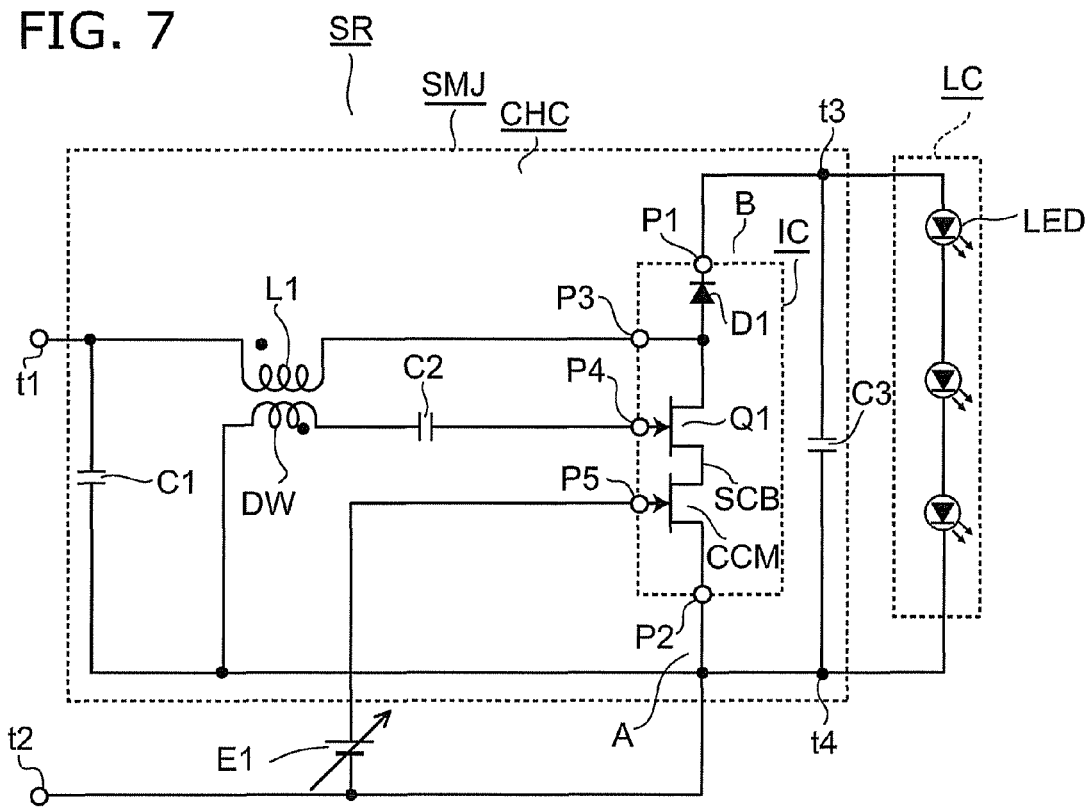
FIG. 7 is a circuit diagram illustrating a switching power supply circuit according to a sixth embodiment.

FIG. 7 is a circuit diagram illustrating a switching power supply circuit according to the sixth embodiment.

As shown in FIG. 7, the switching power supply circuit SR is of the step-up type like the switching power supply circuit SR shown in FIG. 6. The series circuit of the input end t1, the first inductor L1, the first switching element Q1, the constant current element CCM, and the input end t2 constitutes a first circuit A. The series circuit of the input end t1, the first inductor L1, the diode D1, the parallel circuit of the output capacitor C3 and the load circuit LC, and the input end t2 constitutes a second circuit B. That is, the position of the diode D1 connected to the series portion of the first switching element Q1 and the constant current element CCM is different.

The diode D1 is connected in series to the main terminal (drain) of the first switching element Q1. The integrated body SCB includes the diode D1, the switching element Q1, and the constant current element CCM, which are connected in series in this order and integrated. The first external terminal P1 is connected to the main terminal (cathode) of the diode. The second external terminal P2 is connected to the main terminal (source) of the constant current element CCM. The third external terminal P3 is connected to the main terminal (anode) of the diode D1 and the main terminal (drain) of the first switching element Q1. The fourth external terminal P4 is connected to the control terminal (gate) of the first switching element Q1. The fifth external terminal P5 is connected to the control terminal (gate) of the constant current element CCM. The switching power supply device IC is composed of the integrated body SCB and the first to fifth external terminals P1-P5. The configuration of this switching power supply device IC is similar to that in the switching power supply circuit SR shown in FIG. 5.

The second inductor DW is connected between the control terminal (gate) and the other main terminal (source) of the first switching element Q1 through the constant current element CCM and the coupling capacitor C2. The potential source E1 having adjustable potential difference is directly connected between the gate and the source of the constant current element CCM.

Next, a seventh embodiment is described.

Figure 8:
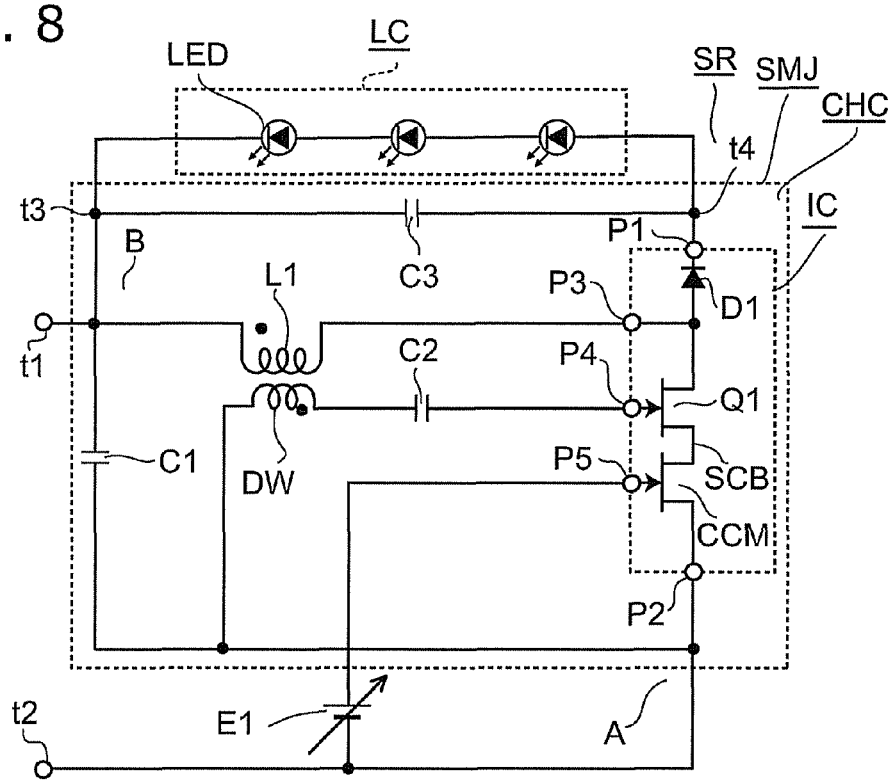
FIG. 8 is a circuit diagram illustrating a switching power supply circuit according to a seventh embodiment.

FIG. 8 is a circuit diagram illustrating a switching power supply circuit according to the seventh embodiment.

As shown in FIG. 8, the switching power supply circuit SR is of the step-up/down type. The series circuit of the input end t1, the first inductor L1, the first switching element Q1, the constant current element CCM, and the input end t2 constitutes a first circuit A. The closed circuit of the first inductor L1, the diode D1, and the parallel circuit of the output capacitor C3 and the load circuit LC constitutes a second circuit B.

The integrated body SCB includes the diode D1, the first switching element Q1, and the constant current element CCM, which are connected in series in this order and integrated. The switching power supply device IC is composed of the integrated body SCB and the first to fifth external terminals P1-P5. The configuration of this switching power supply device IC is similar to that in the switching power supply circuit SR shown in FIGS. 5 and 7.

The second inductor DW is connected between the control terminal (gate) and the other main terminal (source) of the first switching element Q1 through the constant current element CCM. The potential source E1 having adjustable potential difference is directly connected between the control terminal (gate) and the other main terminal (source) of the constant current element CCM.

Next, the circuit operation of the switching power supply circuit SR shown in FIG. 8 is briefly described. When the direct current power supply DC is powered on between the input ends t1, t2, the first switching element Q1 is turned on. Then, an increasing current flows in the first circuit A. The on-state of the first switching element Q1 is maintained because the induction voltage of the second inductor DW applies forward bias to the control terminal (gate) of the first switching element Q1.

When the increasing current reaches the constant current value of the constant current element CCM, the voltage drop of the constant current element CCM rapidly increases. Hence, the potential of the control terminal (gate) of the first switching element Q1 becomes negative relative to the potential of the other main terminal (source). The first switching element Q1 is turned off. When the first switching element Q1 is turned off, the electromagnetic energy accumulated in the first inductor L1 is released, and a decreasing current flows in the second circuit B. The flow of the decreasing current energizes the load circuit LC and activates the load LED. While the decreasing current flows, the second inductor DW applies reverse bias to the first switching element Q1. Hence, the first switching element Q1 is maintained in the off-state.

When the decreasing current becomes zero, the reverse bias to the control terminal (gate) of the first switching element Q1 is lost. Hence, the first switching element Q1 is again turned on. The foregoing operation is repeated.

In the above operation, the on-duty of the first switching element Q1 is denoted by α, the input voltage is denoted by Vin, and the output voltage is denoted by Vout. Then, in the step-up/down type, the relation Vout=Vin·α/(1−α) holds.

Thus, depending on the value of α, an output voltage higher or lower than the input voltage can be obtained.

Next, an eighth embodiment is described.

Figure 9:
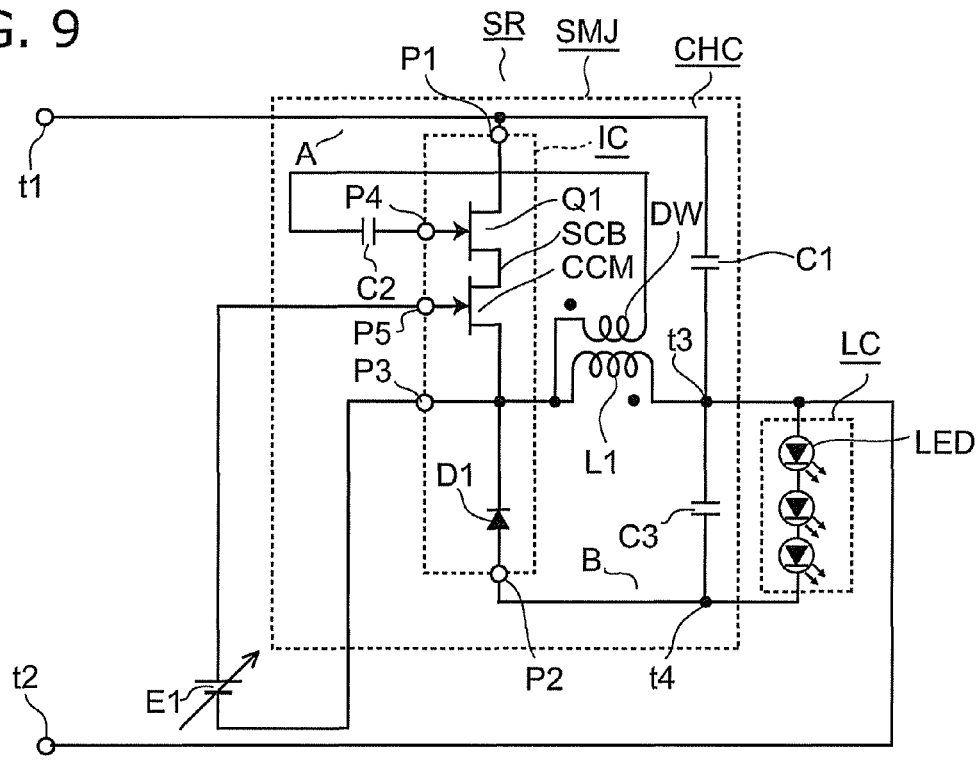
FIG. 9 is a circuit diagram illustrating a switching power supply circuit according to an eighth embodiment.

FIG. 9 is a circuit diagram illustrating a switching power supply circuit according to the eighth embodiment.

As shown in FIG. 9, the switching power supply circuit SR is of the step-up/down type like the switching power supply circuit SR shown in FIG. 8. The series circuit of the input end t1, the first switching element Q1, the constant current element CCM, the first inductor L1, the parallel circuit 1 of the output capacitor C3 and the load circuit LC, and the input end t2 constitutes a first circuit A. The closed circuit of the first inductor L1, the parallel circuit of the output capacitor C3 and the load circuit LC, and the diode D1 constitutes a second circuit B.

The integrated body SCB includes the first switching element Q1, the constant current element CCM, and the diode D1, which are connected in series in this order and integrated. The switching power supply device IC is composed of the integrated body SCB and the first to fifth external terminals P1-P5. The configuration of this switching power supply device IC is similar to that in the switching power supply circuit SR shown in FIGS. 3, 4, and 6.

The second inductor DW is connected between the control terminal (gate) and the other main terminal (source) of the first switching element Q1 through the constant current element CCM and the coupling capacitor C2. The potential source E1 having adjustable potential difference is directly connected between the control terminal (gate) and the terminal (source) of the constant current element CCM.

Next, a ninth embodiment is described.

Figure 10:
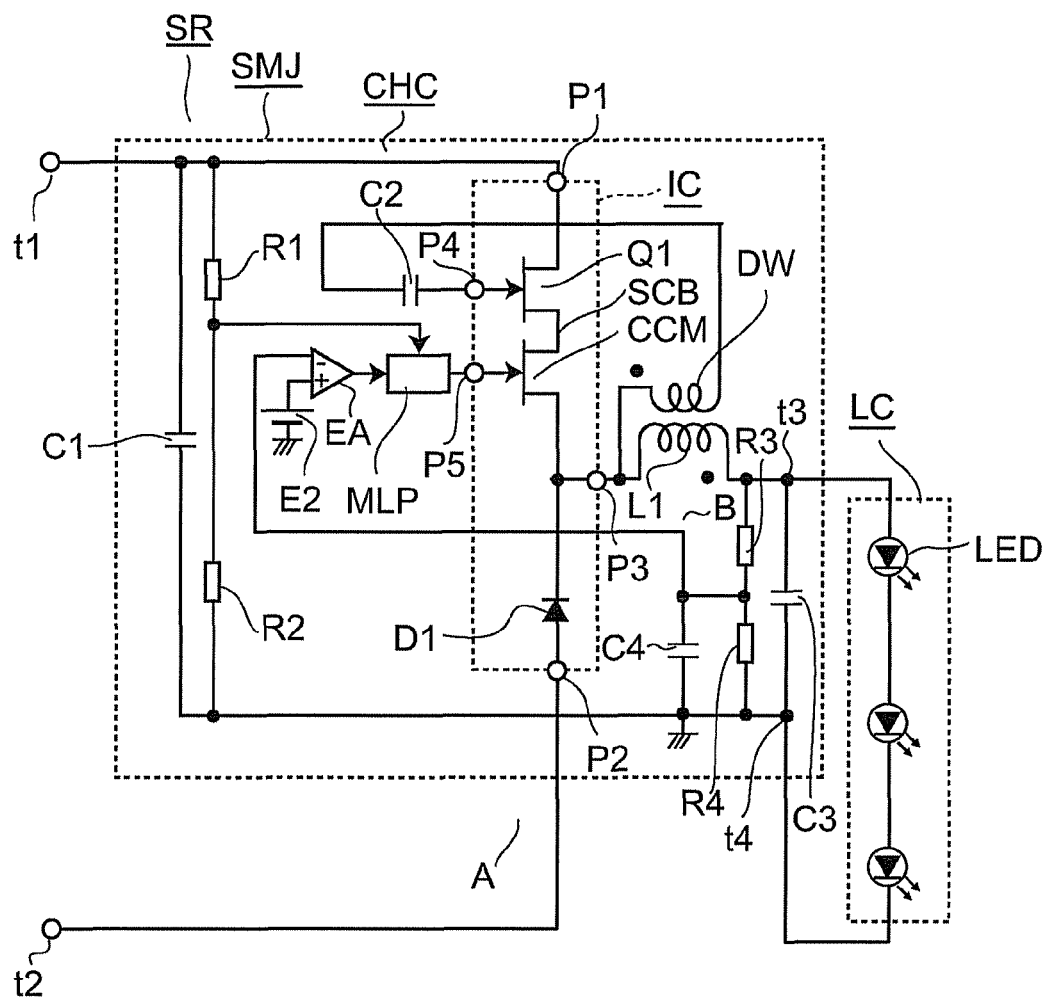
FIG. 10 is a circuit diagram illustrating a switching power supply circuit according to a ninth embodiment.

FIG. 10 is a circuit diagram illustrating a switching power supply circuit according to the ninth embodiment.

As shown in FIG. 10, in the switching power supply circuit SR, the basic configuration of the circuit is of the step-up/down type as in the switching power supply circuit SR shown in FIG. 4. However, the circuit for supplying a potential to the control terminal of the constant current element CCM is different. More specifically, in the embodiment, the following configuration is adopted to control the constant current value of the constant current element CCM in response to input/output voltage variation.

Resistors R1, R2 are connected in series between the input ends t1, t2. The input voltage is taken by voltage division from the connection node of the series circuit of the resistors R1, R2. The input voltage varies with the ripple of the rectified voltage. The input voltage is inputted to one input end of a multiplier MLP.

Next, the circuit operation is briefly described. Resistors R3, R4 are connected in series between the output ends t3, t4 of the chopper circuit CHC. The output voltage is taken by voltage division from the connection node of the series circuit of the resistors R3, R4, and by smoothing in the capacitor C4. The voltage corresponding to the output voltage is inputted to an error amplifier EA and compared with a reference potential E2 corresponding to the target output current. The error amplifier EA outputs the error. The error is inputted to the other input end of the multiplier MLP. The input voltage is multiplied by the error for the target value of the output current. In response to the multiplication output, the control terminal (gate) of the constant current element CCM is controlled. Here, the input of the multiplication output to the control terminal (gate) of the constant current element CCM can be mediated by a driver circuit for driving the control terminal, not shown.

According to the ninth embodiment, the input current of the chopper circuit CHC can be made sinusoidal. Hence, in addition to the effect achieved by the respective embodiments, harmonic distortion of the input power supply can be reduced. Furthermore, the circuit portion requiring high frequency operation can be incorporated in the switching power supply device IC. This reduces consideration for wiring and mounting.

In contrast, in the case where the switching power supply device IC is not used, a resistance element for current detection is required. This results in non-negligible power loss. In addition, a high speed comparator and a high speed driver circuit are required. This involves cost increase. Another problem is that the downsizing of the switching power supply is hampered.

Next, a tenth embodiment is described.

Figure 11:
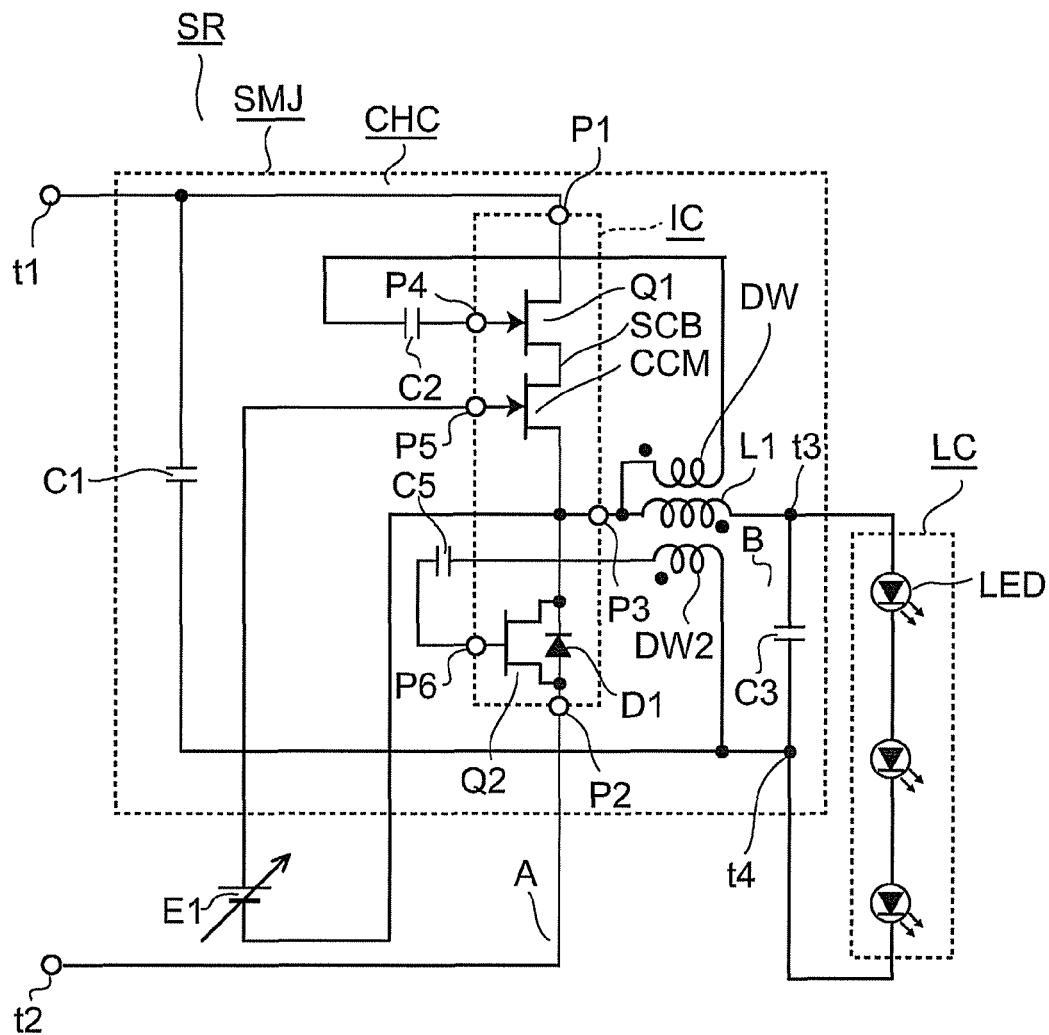
FIG. 11 is a circuit diagram illustrating a switching power supply circuit according to a tenth embodiment.

FIG. 11 is a circuit diagram illustrating a switching power supply circuit according to the tenth embodiment.

As shown in FIG. 11, the switching power supply circuit SR is a step-down switching power supply circuit of the synchronous rectification type.

In the switching power supply device IC, a second switching element Q2 and a sixth external terminal P6 connected to the control terminal of the second switching element Q2 are added to the switching power supply device IC shown in FIG. 4. The second switching element Q2 is connected parallel to the diode D1. Hence, the second circuit B is configured as a closed circuit of the first inductor L1, the parallel circuit of the diode D1 and the second switching element Q2, and the parallel circuit of the output capacitor C3 and the load circuit LC. The first circuit A is similar to that in FIG. 4.

In the switching power supply circuit SR, a third inductor DW2 and a capacitor C5 are added. The third inductor DW2 is magnetically coupled to the first inductor L1. The third inductor DW2 supplies a potential to the control terminal of the second switching element Q2 through the capacitor C5 and the sixth external terminal P6. The potential supplied from the third inductor DW2 to the control terminal of the second switching element Q2 is opposite in polarity to the potential supplied from the second inductor DW to the control terminal of the first switching element Q1. Hence, when the first switching element Q1 is on, the second switching element Q2 is controlled to be turned off. When the first switching element Q1 is off, the second switching element Q2 is controlled to be turned on.

Because of the configuration of the synchronous rectification type, when the first switching element Q1 is off, the decreasing current flows in the second switching element Q2. Hence, the power loss can be reduced as compared with the case of the diode D1 alone.

Here, the dead time provided for preventing cross current is omitted.

In the configuration illustrated in FIG. 11, the second switching element Q2 is incorporated in the switching power supply device IC in a configuration similar to that of the first switching element Q1. However, the second switching element Q2 may be externally connected between the third external terminal P3 and the second external terminal P2 of the switching power supply device IC.

Next, an eleventh embodiment is described.

Figure 12:
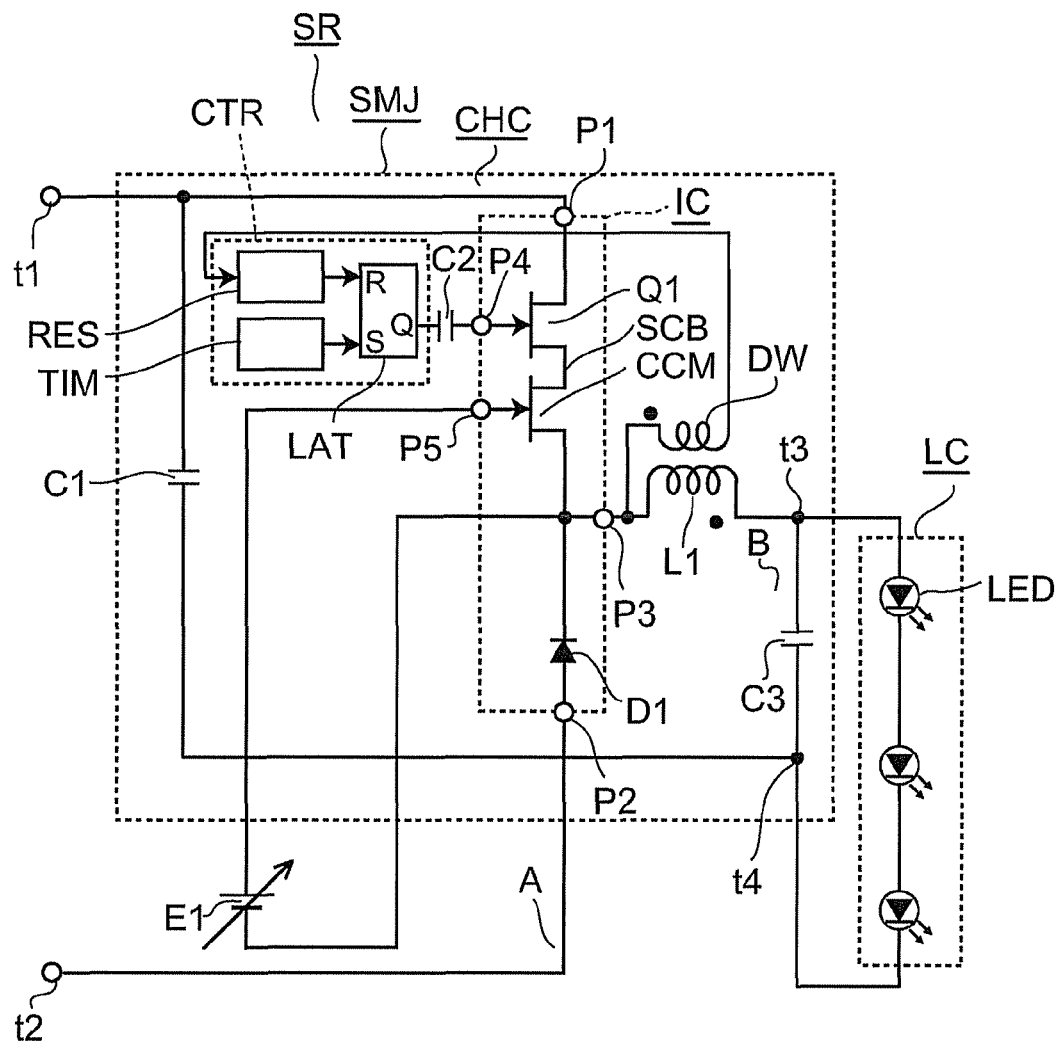
FIG. 12 is a circuit diagram illustrating a switching power supply circuit according to an eleventh embodiment.

FIG. 12 is a circuit diagram illustrating a switching power supply circuit according to the eleventh embodiment.

As shown in FIG. 12, the switching power supply circuit SR is a switching power supply circuit of the separate excitation type. A control circuit CTR for controlling the first switching element Q1 by separate excitation is added to the switching power supply circuit SR shown in FIG. 4. The switching power supply device IC, the first inductor L1, the second inductor DW, and the potential source E1 having adjustable potential difference are similar to those in the switching power supply circuit SR shown in FIG. 4.

In the control circuit CTR, a timer circuit TIM generates a set signal for turning on the first switching element Q1 at a constant cycle. A reset circuit RES detects the polarity change of the potential induced in the second inductor DW. When the first switching element Q1 is switched from on to off, the reset circuit RES generates a reset signal for turning off the first switching element Q1.

The set signal, the constant-cycled pulse signal, outputted from the timer circuit TIM is inputted to the set terminal S of a latch circuit LAT. The reset signal outputted from the reset circuit RES is inputted to the reset terminal R of the latch circuit LAT. When a high level signal is inputted to the set terminal S, the latch circuit LAT is set and holds the set state. A high level signal is outputted to the output terminal Q. On the other hand, when a high level signal is inputted to the reset terminal R, the latch circuit LAT is reset and holds the reset state. A low level signal is outputted to the output terminal Q. The output terminal Q of the latch circuit LAT is connected to the control terminal (gate) of the first switching element Q1 through the coupling capacitor C2. Here, the low level and the high level are potentials at which the potential of the signal is logic 0 (false) and logic 1 (true), respectively.

In FIG. 12, the timer circuit TIM and the reset circuit RES control the first switching element Q1 to be turned on and off through the latch circuit LAT. However, other configurations may be used as long as the first switching element Q1 can be turned on at a constant cycle and turned off by detecting the polarity change of the potential induced in the second inductor DW.

Next, a twelfth embodiment is described.

Figure 13:
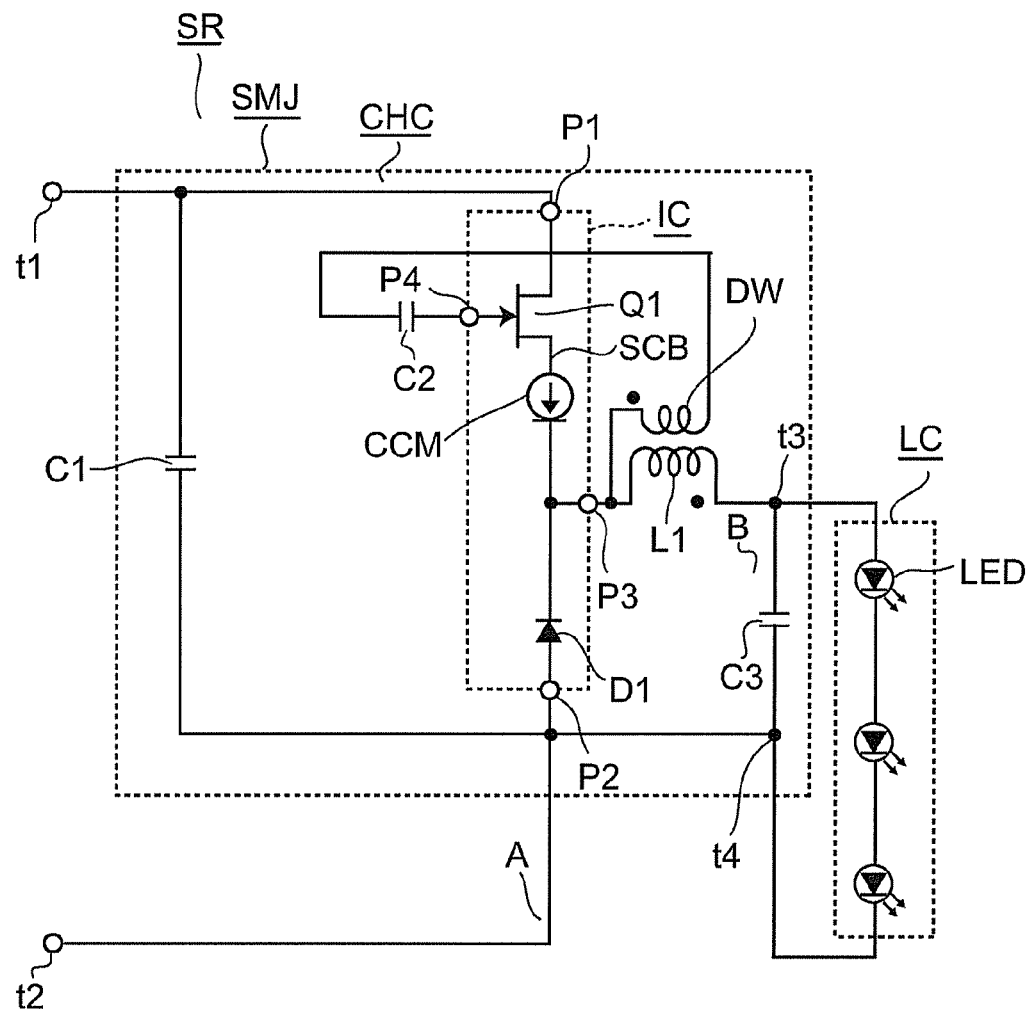
FIG. 13 is a circuit diagram illustrating a switching power supply circuit according to a twelfth embodiment.

FIG. 13 is a circuit diagram illustrating a switching power supply circuit according to the twelfth embodiment.

As shown in FIG. 13, in the switching power supply circuit SR, a constant current diode is used as the constant current element CCM. Thus, the configuration does not use a potential source E1 having adjustable potential difference. The first inductor L1 and the second inductor DW are similar to those in the switching power supply circuit SR shown in FIG. 4.

In the integrated body SCB, the first switching element Q1, the constant current element CCM, and the diode D1 are connected in series and integrated. The switching power supply device IC includes a plurality of external terminals P1-P4. The first external terminal P1 is connected to the main terminal (drain) of the first switching element Q1. The second external terminal P2 is connected to the main terminal (anode) of the diode D1. Here, the first switching element Q1 and the diode D1 are disposed at both ends of the integrated body SCB. The third external terminal P3 is connected to the other main terminal (source) of the constant current element CCM, i.e., to the cathode of the constant current diode and one main terminal (cathode) of the diode D1. The fourth external terminal P4 is connected to the control terminal (gate) of the first switching element Q1.

By the constant current value determined by the constant current diode used as the constant current element CCM, the first switching element Q1 is switched from on to off. The circuit operation is similar to that of the switching power supply circuit SR shown in FIG. 4.

Also in the switching power supply circuits shown in FIGS. 3, 5 to 12, a constant current diode can be used as the constant current element CCM.

In the foregoing, the switching power supply circuits based on the switching power supply device according to the first embodiment have been described with reference to FIGS. 3 to 13.

In the switching power supply device according to the first embodiment, the integrated body of electronic circuit elements operable in the MHz region, such as the switching element, the constant current element, and the diode, is integrated. A plurality of external terminals are connected therefrom. Thus, the following effects (a)-(c) can be achieved.

(a) In the switching power supply device, the first switching element is turned off by using the voltage change of the constant current element when the current flowing in the first switching element reaches a predetermined value. Hence, there is no need to provide a resistance element for current detection and a feedback circuit of the current feedback type for turning off the switching element when the voltage drop of the resistance element reaches a preset threshold. This simplifies the circuit configuration and facilitates downsizing.

(b) Common circuit parts can be adapted to diverse circuit configurations such as step-down type, step-up type, and step-up/down type.

(c) The switching power supply can be significantly downsized by high frequency operation above MHz.

Here, by high frequency operation, the noise component emitted from the mounted device increases and may cause electromagnetic interference between circuit elements. Thus, another problem is to reduce this electromagnetic interference while maintaining downsizing, thereby further advancing the downsizing.

Furthermore, the downsizing involves significant temperature increase of circuit parts such as the switching element due to the heat generated from the circuit parts. Hence, it is also important to decrease the temperature of circuit parts.

Next, a thirteenth embodiment is described.

Figure 14:
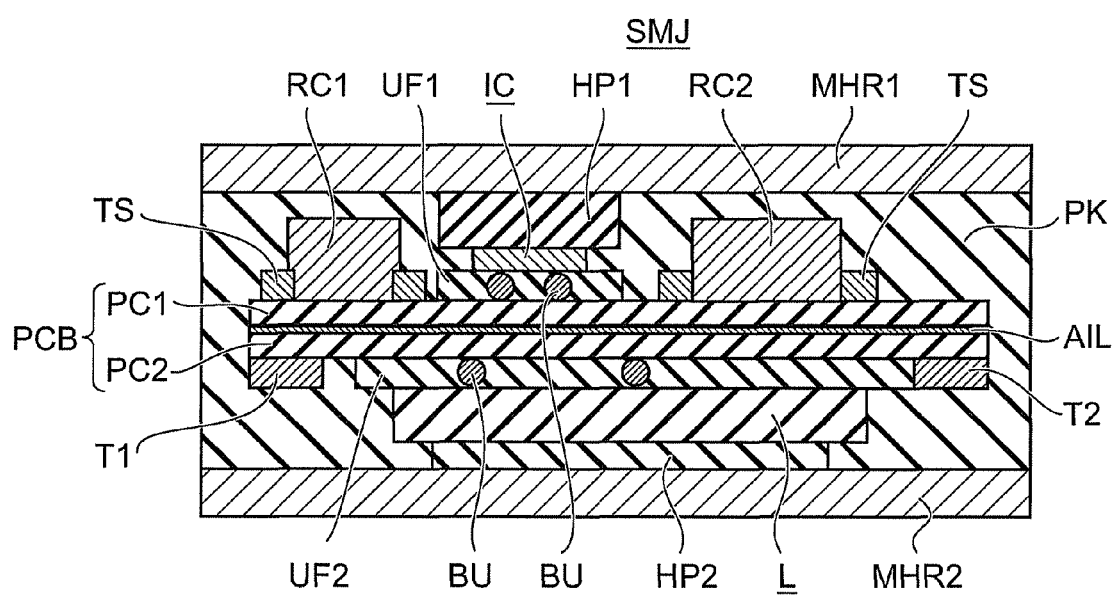
FIG. 14 is a schematic sectional view illustrating a switching power supply device according to a thirteenth embodiment.

FIG. 14 is a schematic sectional view illustrating a switching power supply device according to the thirteenth embodiment.

As shown in FIG. 14, the switching power supply device SMJ according to the thirteenth embodiment includes a mounting substrate PCB, a switching power supply device IC, an inductor L including a first inductor L1 and a second inductor DW, and first and second heat radiators MHR1, MHR2. The switching power supply device SMJ constitutes at least a main part or almost the entirety of the switching power supply circuit SR. Hence, by connecting the switching power supply device SMJ between a direct current power supply (or alternating current power supply) and a load, the load can be energized and activated.

On the mounting substrate PCB, a switching power supply device IC and an inductor L are mounted. The inductor L includes a first inductor L1 and a second inductor DW being magnetically coupled. Other circuit parts RC1 and RC2 may be mounted on the mounting substrate PCB. The mounting substrate PCB provides wiring means by which the main part or almost the entirety of the switching power supply circuit SR having the aforementioned circuit configuration such as shown in FIGS. 3 and 4 is configured as the switching power supply device SMJ. The wiring means of the mounting substrate PCB can be based on various known mounting techniques as appropriate.

In FIG. 14, the mounting substrate PCB has a structure in which two mounting substrates, i.e., first and second mounting substrates PC1, PC2, are laminated across an anti-interference layer AIL. The terminal connecting portions T1, T2 of the mounting substrate PCB are connected to the respective external terminals, not shown, of the switching power supply device SMJ. The current flowing through each of the terminal connecting portions T1, T2 is a direct current. The mounting technique provided by the mounting substrate PCB is not particularly limited. In the mounting technique illustrated in the embodiment, the flip chip mounting and the surface mounting are used in combination.

The anti-interference layer AIL prevents electromagnetic interference between circuit parts mounted on the mounting substrate PCB separately on both surface sides of the anti-interference layer AIL. In the embodiment, the anti-interference layer AIL is made of a thin plate or film-like body of a conductive metal such as copper or aluminum. The anti-interference layer AIL can be grounded if desired. The anti-interference layer AIL may be configured as a ground layer provided in one or both of the first and second mounting substrates PC1, PC2.

The switching device IC is mounted on the first mounting substrate PC1 on one surface side of the anti-interference layer AIL. The switching device IC includes an integrated body SCB. The integrated body SCB includes at least a first switching element Q1 responsible for the main switching operation as a switching power supply. The integrated body SCB and the first switching element Q1 included in the integrated body SCB are similar to those of the switching device IC in the first embodiment.

In FIG. 14, the switching device IC is flip chip mounted on one surface side of the mounting substrate PCB. In the switching device IC, an underfill UF1 is filled between the mounting substrate PCB and the space around the solder bump BU of the switching device IC. Thus, in this configuration, moistureproofness of the mounting site is maintained.

The inductor L includes a first inductor L1 and a second inductor DW being magnetically coupled. The inductor L is mounted in low profile on the other surface side of the anti-interference layer AIL, i.e., on the second mounting substrate PC2, and opposed to the switching device IC. The first inductor L1 and the second inductor DW included in the inductor L function as main circuit parts for chopper operation in cooperation with the switching device IC. The method for mounting the inductor L on the mounting substrate PCB is not particularly limited. In the embodiment, as shown in FIG. 14, the inductor L is flip chip mounted. Here, in FIG. 14, an underfill UF2 is filled between the mounting substrate PCB and the space around the solder bump BU provided on the inductor L. Thus, in this configuration, moistureproofness of the mounting site is maintained.

Figure 15:
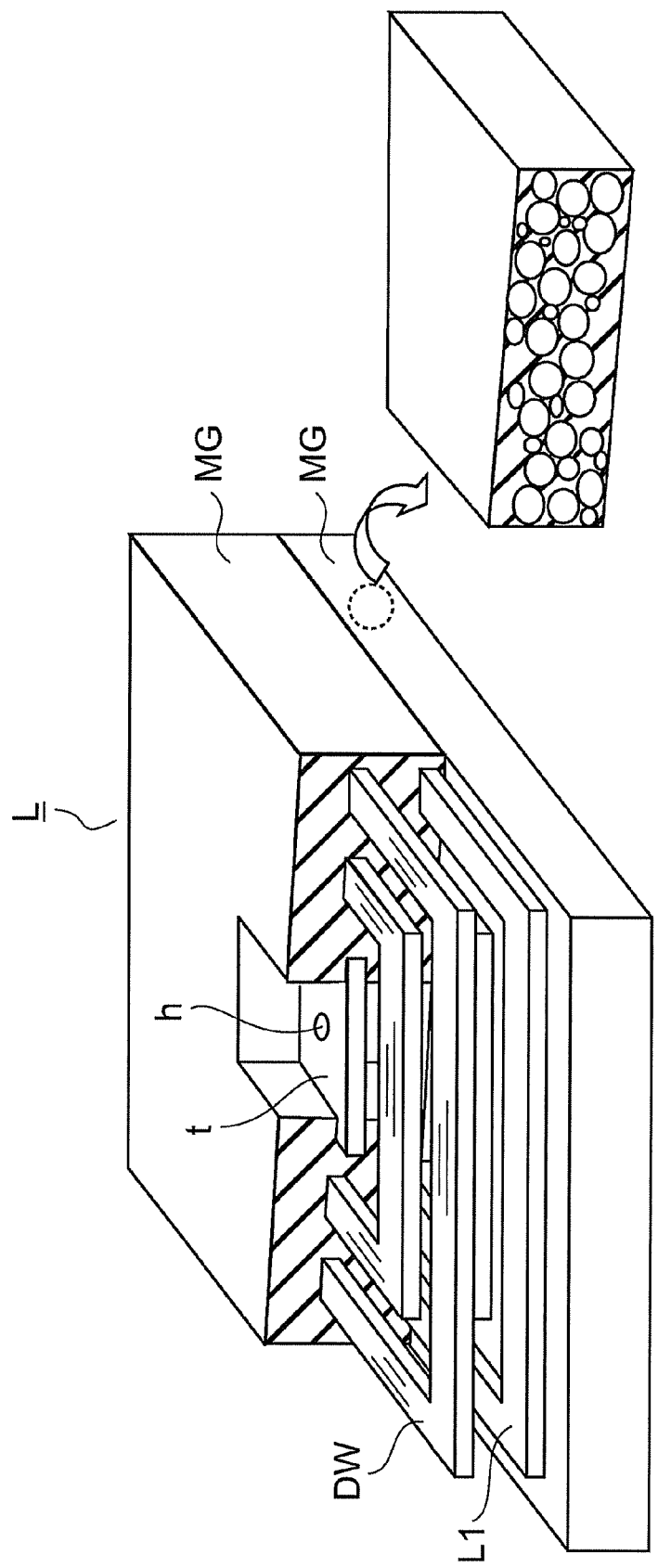
FIGS. 15A and 15B illustrate the first and second inductors.

FIGS. 15A and 15B illustrate the first and second inductors. More specifically, FIG. 15A is a schematic partial sectional perspective view, and FIG. 15B is a partial enlarged view.

As shown in FIG. 15A, the inductor L configured in low profile can be formed from the first inductor L and the second inductor DW by winding e.g. a flat coil wire in a planar spiral pattern. The flat coil wires are held so as to be appropriately spaced from each other. Furthermore, the inside and the periphery of the inductor L are covered with a magnetic layer MG. Thus, as a whole, the inductor L is configured in a planar shape.

One end of the first inductor L1 and the second inductor DW is disposed in the center portion of the coil and constitutes a terminal portion t. A through hole h is formed at the center of the terminal portion t and connected to the external terminal of the switching device IC. As an example configuration, the conductor of the other main terminal (source) of the constant current element CCM is inserted into the through hole h. Furthermore, a conductive material is injected therein to connect together the first inductor L1, the second inductor DW, and the third external terminal P3, which is the connecting conductor of the switching device IC. Here, as shown in the enlarged cross section of FIG. 15B, the magnetic layer MG is made of e.g. ceramic or plastic dispersed with ferrite fine particles.

In the case where the operating frequency of the inductor L is in the region above MHz, or preferably above 10 MHz, the value of its inductance can be small accordingly. Hence, besides the above configuration, the inductor L may be directly placed inside the mounting substrate PCB. More specifically, a coil pattern can be formed as part of the wiring pattern of the mounting substrate PCB, and a magnetic sheet can be stacked on the coil pattern. Thus, the inductor L can be formed in low profile.

The other circuit parts RC1, RC2 are circuit parts of the switching power supply circuit SR other than the switching device IC and the inductor L described above. For instance, the other circuit parts include the rectifier circuit Rec made of a diode bridge constituting the direct current power supply DC shown in FIG. 1, the capacitors C1 to C5 shown in FIGS. 3 to 13, resistors constituting the potential source E1 having adjustable potential difference and the detection circuit associated therewith, and control circuit parts such as capacitors and comparators, not shown.

In the configuration illustrated in FIG. 14, the other circuit parts RC1, RC2 are mounted on the mounting substrate PCB by surface mounting using reflow solder. Here, external terminals TS are provided on both side surface portions of the surface mounted circuit parts RC1, RC2.

The first and second heat radiators MHR1, MHR2 externally radiate heat generated in the switching device IC and the inductor L. The first and second heat radiators MHR1, MHR2 are made of e.g. metal. The first heat radiator MHR1 is in contact with the surface of the switching device IC opposite to the mounting substrate PCB via a heat pipe HP1 so as to radiate the generated heat of the switching device IC. The first heat radiator MHR1 is thermally coupled to the switching device IC through a heat pipe HP1. The second heat radiator MHR2 is in contact with the surface of the inductor L1 opposite to the mounting substrate PCB via a heat pipe HP2 so as to radiate the generated heat of the inductor L. The second heat radiator MHR2 is thermally coupled to the inductor L through a heat pipe HP2. The first and second heat radiators MHR1, MHR2 are preferably exposed at the outer surface of the package PK described later.

The switching power supply device SMJ has the above configuration. As a result, the switching device IC and the inductor L are sandwiched between the first and second heat radiators MHR1, MHR2. Hence, the first and second heat radiators MHR1, MHR2 function as a shield of the switching device IC and the inductor L. To further improve the function as an electromagnetic shield member and the function as a heat radiator, as shown in FIG. 14, the area of the first and second heat radiators MHR1, MHR2 can be made definitely larger than that of the aforementioned surface of the switching device IC and the inductor L.

The package PK encloses the entirety of the switching power supply device SMJ. Thus, the package PK protects the circuit parts and their circuits housed therein, and facilitates handling the switching power supply device SMJ. In the configuration illustrated in FIG. 14, the package PK is formed by resin molding. However, it is understood that other known types of packages primarily composed of e.g. ceramic or metal can be used as appropriate.

In the embodiment, the first and second heat radiators MHR1, MHR2 are exposed at the outer surface of the package PK. Thus, simply by attaching the switching power supply device SMJ to a target object, the generated heat of the switching power supply device SMJ can be conducted to the target object. Hence, if the target object has good heat radiation performance, the generated heat of the switching power supply device SMJ can be radiated to suppress temperature increase. Here, the first heat radiator MHR1 in thermal conductive contact with the switching power supply device IC can be attached to the target object in abutment therewith. This further suppresses temperature increase, and reduces noise generation. This is because the amount of generated heat and noise emission is larger in the switching device IC than in the inductor L.

The example circuit configuration of the switching power supply circuit SR based on the switching power supply device SMJ can be made similar to those in FIGS. 3 to 13 described above. More specifically, the switching power supply circuit SR includes a direct current power supply DC and a chopper circuit CHC. The input end is connected to an alternating current power supply AC. The output end is connected with a load circuit LC. The chopper circuit CHC can be configured as the switching power supply device SMJ. However, if desired, the entirety including the direct current power supply DC may be configured as the switching power supply device SMJ.

Next, a fourteenth embodiment is described.

Figure 16:
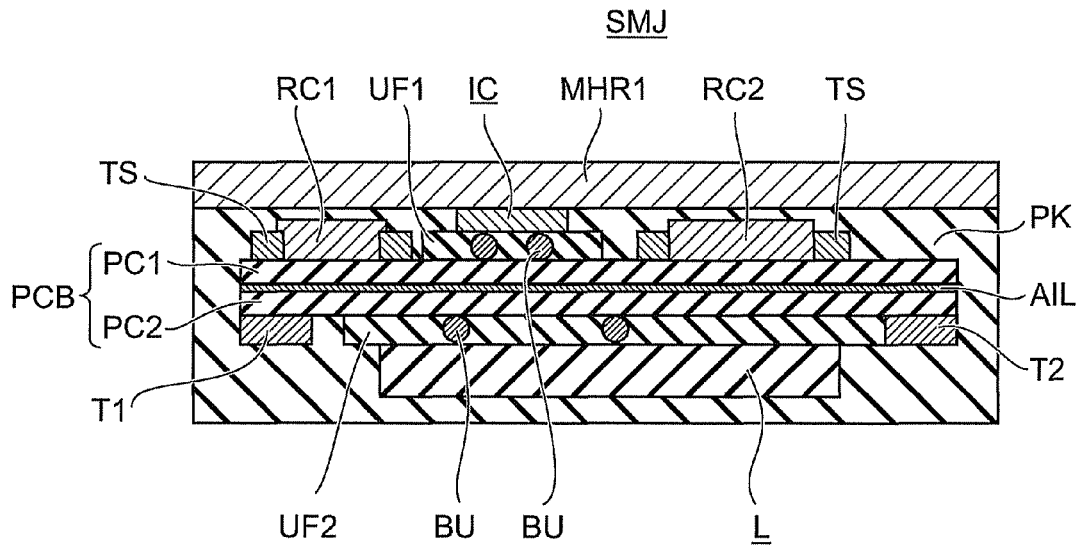
FIG. 16 is a schematic sectional view illustrating a switching power supply device according to a fourteenth embodiment.

FIG. 16 is a schematic sectional view illustrating a switching power supply device according to the fourteenth embodiment.

As shown in FIG. 16, the switching power supply device SMJ includes a first heat radiator MHR1 in contact with the switching power supply device IC. However, no heat radiator is provided on the inductor L. The same portions as those in FIG. 14 are labeled with like reference numerals, and the description thereof is omitted.

As described above, the amount of generated heat and noise emission is larger in the switching power supply device IC than in the inductor L. If the placement of the heat radiator on the latter can be omitted, the embodiment is applicable, and the structure is simplified accordingly.

Next, a fifteenth embodiment is described.

Figure 17:
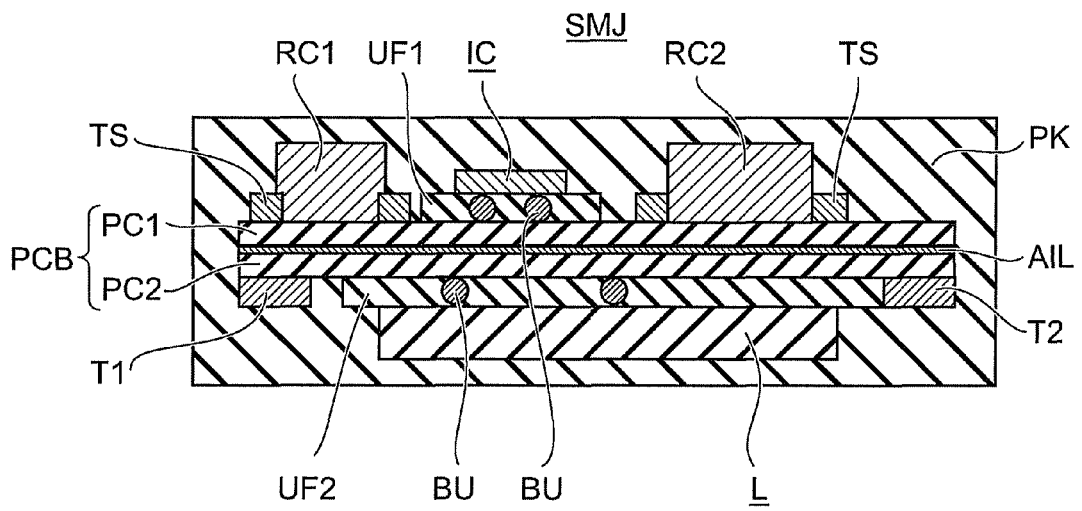
FIG. 17 is a schematic sectional view illustrating a switching power supply device according to a fifteenth embodiment.

FIG. 17 is a schematic sectional view illustrating a switching power supply device according to the fifteenth embodiment.

As shown in FIG. 17, the switching power supply device SMJ includes no heat radiator in contact with the switching power supply device IC and the inductor L. In this figure, the same portions as those in FIG. 14 are labeled with like reference numerals, and the description thereof is omitted.

For instance, for reasons of e.g. low switching frequency, the amount of generated heat and noise emission in the switching power supply device IC and the inductor L may be small. In this case, there is no need to provide an extra heat radiator on the switching power supply device SMJ. Thus, the embodiment is applicable.

Hence, according to the embodiment, the structure of the switching power supply device SMJ is made simpler and more cost effective than those in the thirteenth and fourteenth embodiments.

Next, a sixteenth embodiment is described.

Figure 18:
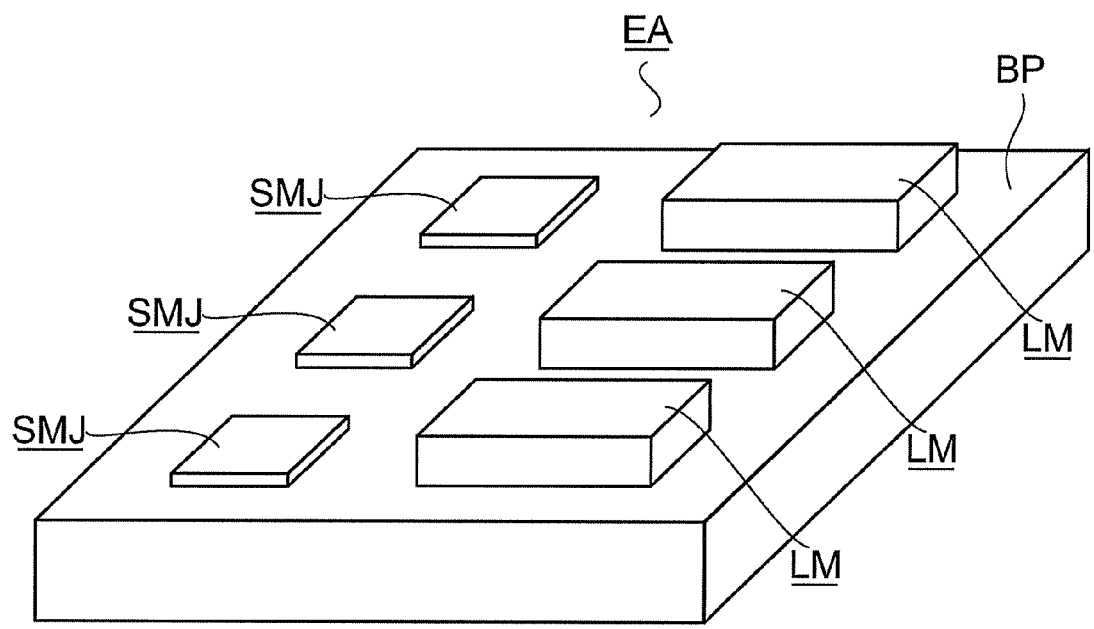
FIG. 18 is a perspective view illustrating an electrical equipment according to a sixteenth embodiment.

FIG. 18 is a perspective view illustrating an electrical equipment according to the sixteenth embodiment.

As shown in FIG. 18, the electrical equipment EA is an LED illumination device. In the configuration of this LED illumination device, a plurality of pairs of LED modules (main body) LM and switching power supply devices (power supply) SMJ are arrayed on a support substrate BP.

The support substrate BP is made of a material having good thermal conductivity such as aluminum. The switching power supply device SMJ can be based on e.g. one of the configurations illustrated in FIGS. 14 to 16. In the switching power supply device SMJ, the switching power supply device IC illustrated in e.g. FIG. 1 is attached between the mounting substrate PCB and the support substrate BP.

By the above configuration, the switching device IC having high heat generation and noise emission is sandwiched between the support substrate BP and the anti-interference layer AIL of the mounting substrate PCB. Furthermore, the switching power supply device IC is made relatively closer to the support substrate BP. This facilitates reducing temperature increase and noise emission. In the case of the switching power supply device SMJ having the configuration illustrated in FIG. 14 or 16, the heat radiator MHR1 in contact and thermal coupling with the switching power supply device IC is brought into contact and thermal coupling with the support substrate BP by the attachment of the switching power supply device SMJ. Hence, the temperature increase and noise emission of the switching power supply device IC are effectively suppressed.

Furthermore, according to the embodiment, the LED module LM and the switching power supply device SMJ constituting a pair can be placed adjacently on the support substrate BP. This facilitates maintenance, and the appearance is also made neat and favorable.

The embodiments of the invention have been described above with reference to examples. However, the invention is not limited thereto, but can be variously modified.

What is claimed is:

1. A switching power supply circuit, comprising:
a first switching element;
a second switching element connected in series to the first switching element and configured to turn off the first switching element in response to a current of the first switching element exceeding a predetermined current value, the second switching element comprising a control terminal supplied with a variable potential that defines the predetermined current value for turning off the first switching element; and
a diode connected in series to either of the first switching element or the second switching element and allowing current while the first switching element is off.

2. The circuit according to claim 1, further comprising:
a timer circuit configured to generate a constant-cycled pulse signal and to turn on the first switching element; and
a reset circuit configured to generate a signal for maintaining a turn-off state of the first switching element when the first switching element is turned off by the current second switching element.

3. The circuit according to claim 1, wherein the diode is connected in series to the second switching element.

4. The circuit according to claim 1, wherein the diode is connected in series to the first switching element.

5. The switching power supply circuit according to claim 1, wherein the second switching element comprises a junction field-effect transistor.

6. The switching power supply circuit according to claim 5, wherein the control terminal comprises a gate of the junction field-effect transistor.

7. An electrical equipment, comprising:
a main body; and
a power supply comprising a switching power supply circuit and configured to supply power supply voltage to the main body,
the switching power supply circuit comprising:
a first switching element;
a second switching element connected in series to the first switching element and configured to turn off the first switching element in response to a current of the first switching element exceeding a predetermined current value, the second switching element comprising a control terminal, the control terminal being supplied with a variable potential defining the predetermined current value for turning off the first switching element; and a diode connected in series to either of the first switching element or the second switching element and configured to pass current while the first switching element is off.

8. The electrical equipment according to claim 7, wherein the second switching element comprises a junction field-effect transistor.

9. The electrical equipment according to claim 8, wherein the control terminal comprises a gate of the junction field-effect transistor.

10. A switching power supply circuit comprising:

a first switching element;

a constant current element connected in series with the first switching element and configured to turn off the first switching element in response to detecting that a current of the first switching element exceeds a defined current value;

a diode connected in series with either of the first switching element or the constant current element and allowing current in response to detecting that the first switching element is off; and a second switching element connected in parallel with the diode and configured to be turned off when the first switching element is on, and to be turned on when the first switching element is off.

\* \* \* \* \*